(12) United States Patent
Hirose et al.

(10) Patent No.: US 7,364,626 B2
(45) Date of Patent: Apr. 29, 2008

(54) SUBSTRATE PROCESSING APPARATUS AND SUBSTRATE PROCESSING METHOD

(75) Inventors: Keizo Hirose, Nirasaki (JP); Kenji Sekiguchi, Nirasaki (JP)

(73) Assignee: Tokyo Electron Limited, Tokyo-To (JP)

(*) Notice: Subject to any disclaimer, the term of this patent is extended or adjusted under 35 U.S.C. 154(b) by 496 days.

(21) Appl. No.: 10/285,411

(22) Filed: Nov. 1, 2002

(65) Prior Publication Data

US 2003/0079764 A1    May 1, 2003

(30) Foreign Application Priority Data

Nov. 1, 2001    (JP)    ............... 2001-336461

(51) Int. Cl.
B08B 3/04    (2006.01)
(52) U.S. Cl. .............. 134/2; 134/26; 134/33; 134/36; 134/95.3; 134/144; 134/153; 134/902
(58) Field of Classification Search .......... 134/2, 134/26, 30, 33, 34, 36, 95.1, 95.3, 99.1, 102.1, 134/102.2, 144, 153, 157, 902
See application file for complete search history.

(56) References Cited

U.S. PATENT DOCUMENTS

| | | | | |
|---|---|---|---|---|
| 5,375,291 A | * | 12/1994 | Tateyama et al. | 15/302 |
| 5,695,817 A | * | 12/1997 | Tateyama et al. | 427/240 |
| 5,803,970 A | * | 9/1998 | Tateyama et al. | 118/319 |
| 6,096,233 A | * | 8/2000 | Taniyama et al. | 216/92 |
| 6,197,150 B1 | * | 3/2001 | Kwag et al. | 156/345.23 |
| 6,247,479 B1 | * | 6/2001 | Taniyama et al. | 134/95.2 |
| 6,558,478 B1 | * | 5/2003 | Katakabe et al. | 134/33 |
| 6,568,408 B2 | * | 5/2003 | Mertens et al. | 134/95.2 |
| 6,745,784 B2 | * | 6/2004 | Katakabe et al. | 134/153 |
| 6,810,888 B2 | * | 11/2004 | Tsuchiya et al. | 134/104.2 |
| 6,821,349 B2 | * | 11/2004 | Mertens et al. | 134/2 |
| 2002/0035762 A1 | * | 3/2002 | Okuda et al. | 15/77 |
| 2004/0045589 A1 | * | 3/2004 | Holsteyns et al. | 134/32 |
| 2004/0206378 A1 | * | 10/2004 | Okuda et al. | 134/56 R |
| 2004/0206379 A1 | * | 10/2004 | Okuda et al. | 134/102.1 |

FOREIGN PATENT DOCUMENTS

| | | |
|---|---|---|
| JP | 5-144793 | 6/1993 |
| JP | 10-156229 | 6/1998 |
| JP | 2000-138197 | 5/2000 |
| JP | 2000-164551 | 6/2000 |
| JP | 2000-269178 | 9/2000 |

* cited by examiner

Primary Examiner—Joseph L. Perrin
(74) Attorney, Agent, or Firm—Smith, Gambrell & Russell, LLP

(57) ABSTRACT

Substrate cleaning apparatus and method capable of preventing adhesion of particles to a substrate irrespective of being hydrophilic or hydrophobic are provided. Although a cleaning liquid ejected from a two-fluid nozzle 36 rebounds from a cup CP and scatters in the form of mist toward the center side of a wafer W, a rinsing liquid is supplied from a rinse nozzle 35 to form a water film 51 on the wafer W. Owing to the presence of the water film 51, the surface of the wafer W is protected from adhesion of particles contained in the mist. It is possible to prevent the particles in the mist from adhering to the wafer W and also possible to prevent a bad influence on the wafer W.

17 Claims, 18 Drawing Sheets

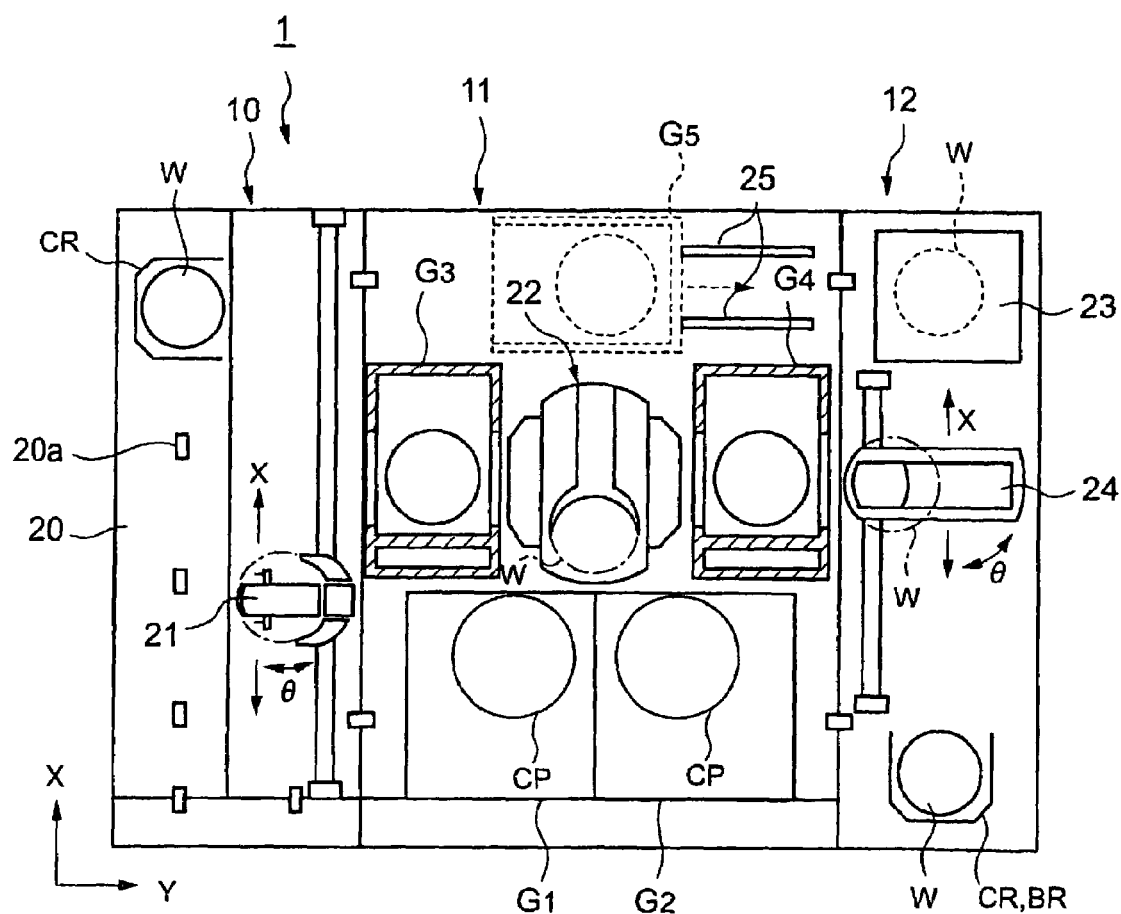
F I G. 1

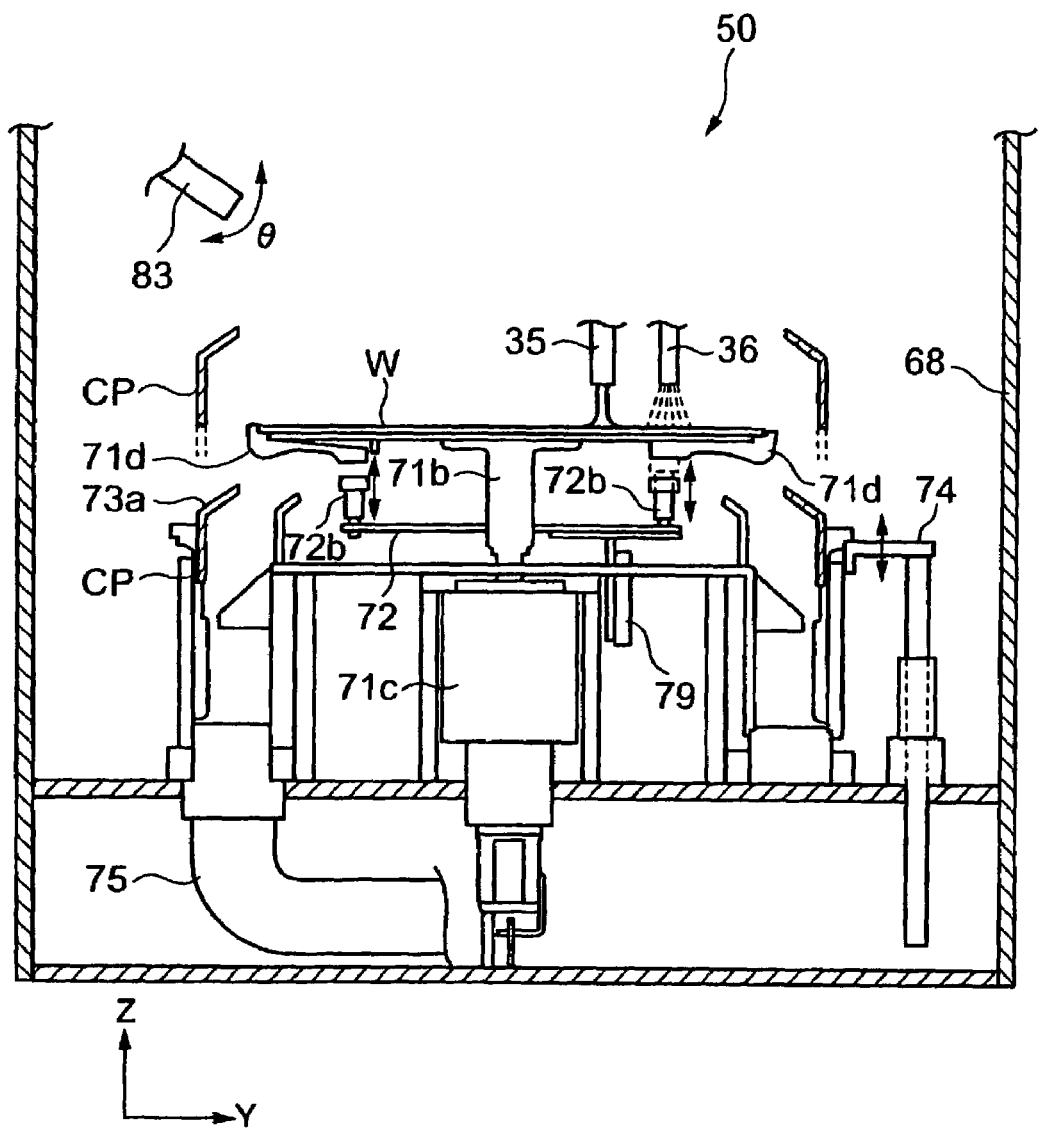
F I G. 5

FLOW RATE OF RINSING LIQUID

| WAFER CENTER | 0.5 l/min |
|---|---|
| WAFER PERIPHERY | 1.2 l/min |

FIG. 14A

MOVING SPEED OF RINSE NOZZLE

| WAFER CENTER | 7 mm/sec |
|---|---|
| WAFER PERIPHERY | 5 mm/sec |

FIG. 14B

NUMBER OF REVOLUTIONS OF WAFER

| WAFER CENTER | 1500 rpm |
|---|---|
| WAFER PERIPHERY | 1000 rpm |

FIG. 14C

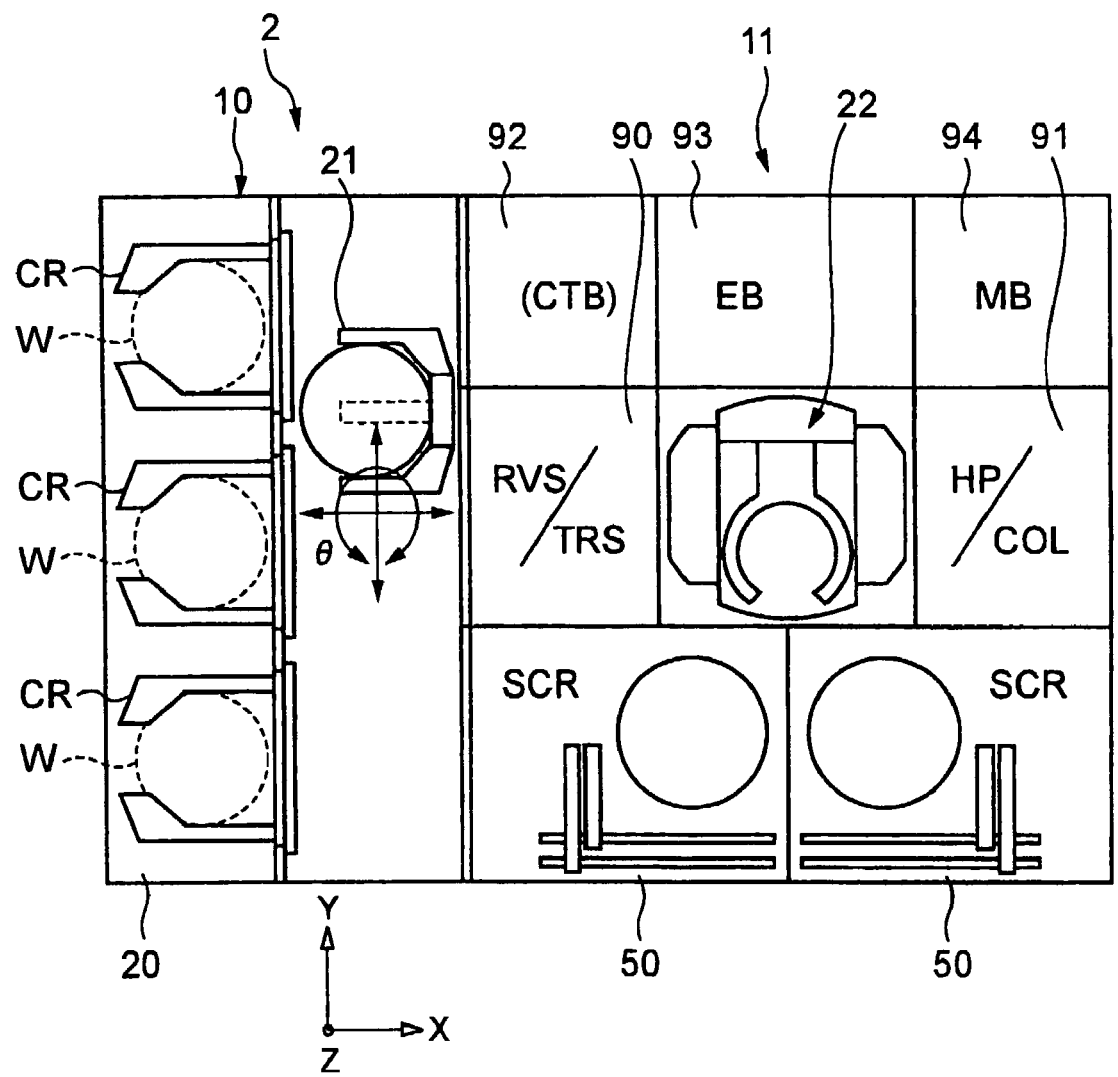
F I G. 19

SUBSTRATE PROCESSING APPARATUS AND SUBSTRATE PROCESSING METHOD

BACKGROUND OF THE INVENTION

1. Technical Field of the Invention

This invention relates to substrate processing apparatus and method for cleaning a semiconductor wafer substrate in the production of semiconductor devices.

2. Description of the Related Art

In the manufacture of semiconductor devices, it is required to maintain high cleanness of both sides of each semiconductor wafer (called as "wafer" hereinafter), especially, high cleanness of a wafer's surface on which a semiconductor device is formed. In this view, it is performed to clean (wash) both sides of each wafer before and after various manufacturing processes.

In a photo-lithography process, particularly, it is indispensable to clean both sides of the wafer. In this process, for example, a scrub cleaning is performed to remove various contaminants from the wafer. In the cleaning, the wafer is accommodated in a cup for preventing scattering of cleaning liquid or collecting the cleaning liquid after use, for waste. Then, the cleaning liquid is supplied on an upper face of the wafer while rotating it in the cup. While supplying the cleaning liquid, it is further performed to make a rotating brush abut on the upper face of the wafer and further reciprocate the brush between the center of the wafer and its periphery. In this way, contaminants, such as particles, adhering to the upper face of the wafer are removed in a scrub cleaning.

In the scrub cleaning of late years, besides the cleaning using the rotating brush, it is attempted to eject an ultrasonic cleaning water or a mixture fluid (two-fluid), which is obtained by mixing inert gas with pure water, onto the wafer through a nozzle, thereby removing finer particles from the wafer.

However, the above wafer cleaning on the ejection of the cleaning liquid, such as ultrasonic water and two-fluid, causes the so-ejected cleaning water to rebound from an inner wall of the cup accommodating the wafer, in the form of a mist. Consequently, particles etc. adhering to the inner wall of the cup are sprinkled around together with the rebounding mist. Then, the so-scattered particles stick to the wafer. Essentially, the cup is intended to prevent the cleaning liquid from being scattered around during the cleaning process of the wafer and also allow the cleaning liquid to fall along the inner wall of the cup. Nevertheless, when using the cleaning water, such as ultrasonic water and two-fluid, the cleaning liquid is apt to rebound from the inner wall of the cup due to a great amount of flow rate and the intensity of ejection.

In case of a hydrophilic wafer to be processed, there is no problem because a contact angle of the cleaning liquid, which includes particles adhering to the wafer, with a wafer surface is so small that the cleaning liquid is easy to fall down from the wafer together with the particles. While, in case of a hydrophobic wafer to be processed, the contact angle is so large that wetness is deteriorated. There is a tendency for the hydrophobic wafer to expose its surface to the outside despite that the cleaning liquid is being ejected. In such a case, a problem arises in that so-called "misty particles" adhere to the wafer surface directly. It is difficult to remove the so-adhered particles from the wafer.

SUMMARY OF THE INVENTION

Under such a circumference as mentioned above, an object of the present invention is to provide substrate processing apparatus and method by which it becomes possible to prevent the particles from adhering to the substrate whether it is hydrophilic or hydrophobic.

In order to attain the above object to be solved, a substrate cleaning apparatus comprises: a holding part for holding a substrate rotatably; a cleaning nozzle for ejecting a cleaning liquid to the substrate, the cleaning nozzle being movable above the substrate in rotating and in the radial direction of the substrate; and a liquid nozzle which supplies a liquid onto the substrate when cleaning the substrate by the cleaning nozzle, thereby forming a liquid film on the substrate. With the above constitution, the cleaning operation is carried out by ejecting the cleaning liquid while forming a hydrophilic liquid film of the substrate. For example, when a hydrophobic substrate is accommodated in a cup and subjected to a cleaning process, mist of the cleaning liquid rebounding from the cup adheres to the hydrophilic liquid film, so that particles contained in the mist are discharged from the substrate by a centrifugal force of the rotating substrate, together with the liquid film. Consequently, it is possible to prevent the particles from adhering to the substrate directly.

Preferably, the liquid supplied onto the substrate by the liquid nozzle is supplied closer to a rotating center of the substrate than the cleaning nozzle.

More preferably, the substrate cleaning apparatus further comprises a control unit that controls the operation of the substrate cleaning apparatus so as to start supplying the liquid through the liquid nozzle when the cleaning nozzle gets access to the vicinity of the periphery of the substrate.

More preferably, the substrate is a hydrophobic wafer.

More preferably, liquid to be supplied onto the substrate through the liquid nozzle is a rinsing liquid.

More preferably, the rinsing liquid supplied by the liquid nozzle is a pure water.

More preferably, the cleaning liquid is a mixture fluid composed of inert gas and liquid. For example, if nitrogen gas is used as the inert gas and the cleaning process for the substrate is carried out by means of an ejecting pressure of the gas and the liquid, then there is produced a situation that an amount of the scattering cleaning liquid is so increased to facilitate generating of the mist. In such a case, the formation of the liquid film in accordance with the present invention has much effect to prevent adhesion of the mist.

More preferably, the liquid nozzle is movably arranged in one body with the cleaning nozzle moving.

More preferably, the liquid nozzle is arranged closer to a center of the substrate than the cleaning nozzle moving.

More preferably, a distance between the cleaning nozzle and the liquid nozzle ranges from 5 mm to 80 mm.

Thus, the liquid nozzle is arranged closer to a center of the substrate than the cleaning nozzle moving and ejecting the cleaning liquid, allowing the liquid to be supplied closer to the center of the substrate than a substrate's position to which the cleaning liquid is supplied. Therefore, for example, even if the cleaning nozzle deviates from the periphery of the substrate outward, the liquid nozzle always supplies the periphery of the substrate with the liquid to form its film on the substrate. Accordingly, it is possible to prevent the particles from adhering to the substrate's periphery having a lot of mist rebounding from the cup particularly. Further, even when a rinsing liquid is used as the liquid, there can be obtained an effect similar to the above effect.

More preferably, the substrate cleaning apparatus further comprises a control unit that controls the operation of the substrate cleaning apparatus so that a flow rate of the liquid supplied to the periphery of the substrate by the liquid nozzle becomes more than a flow rate of the liquid supplied to the center of the substrate by the liquid nozzle.

More preferably, the substrate cleaning apparatus further comprises a control unit that controls the operation of the substrate cleaning apparatus so that a speed of the liquid nozzle in supplying the periphery of the substrate with the liquid becomes smaller than a speed of the liquid nozzle in supplying the center of the substrate with the liquid.

Although the rotating speed of the substrate has a difference between its center and the periphery, it is possible to make an amount of the liquid supplied onto the center of the substrate per unit time equal to an amount of the liquid supplied onto the periphery of the substrate per unit time by altering the flow rate of the liquid or the moving speed of the liquid nozzle in the above way. As a result, it is possible to realize a uniform cleaning capability throughout the surface of the substrate.

More preferably, the substrate cleaning apparatus further comprises a control unit that controls the operation of the substrate cleaning apparatus so that a revolution speed of the substrate when the liquid nozzle supplies the periphery of the substrate with the liquid becomes smaller than a revolution speed of the substrate when the liquid nozzle supplies the center of the substrate with the liquid.

Thus, since the rotating speed of the substrate is changed corresponding to the position of the supplied liquid, it is possible to make an amount of the liquid supplied onto the center of the substrate per unit time equal to an amount of the liquid supplied onto the periphery of the substrate per unit time. As a result, it is possible to realize a uniform cleaning capability throughout the surface of the substrate.

More preferably, a flow rate of the inert gas of the cleaning liquid ranges from 10 N l/mm. to 200 N l/mm.

More preferably, the flow rate of the inert gas of the cleaning liquid is 80 N l/mm.

More preferably, a flow rate of the liquid supplied by the liquid nozzle ranges from 0.5 l/mm. to 1.2 l/mm.

More preferably, a speed of the liquid nozzle ranges from 5 mm/sec to 30 mm/sec.

More preferably, a revolution speed of the substrate ranges from 300 r.p.m. to 5000 r.p.m.

In yet another embodiment, a substrate cleaning apparatus comprises: a holding part for holding a substrate rotatably; a cleaning nozzle for ejecting a cleaning liquid to the substrate, the cleaning nozzle being movable above the substrate in rotating and in the radial direction of the substrate; a first liquid nozzle arranged to be movable in one body with the cleaning nozzle moving, the first liquid nozzle supplying a liquid onto the substrate when the substrate is cleaned by the cleaning nozzle, thereby forming a liquid film on the substrate; and a second liquid nozzle which supplies a liquid to a designated position on the substrate when the substrate is cleaned by the cleaning nozzle, thereby forming the liquid film on the substrate together with the first liquid nozzle.

According to the above constitution, while moving the first liquid nozzle in one body with the cleaning nozzle, it is carried out to eject the cleaning liquid and form a hydrophilic liquid film on the substrate. Particularly, the formation of the liquid film is accomplished in the vicinity of the cleaning nozzle certainly. Further, since the second liquid nozzle supplies the center portion of the substrate with the liquid, the formation of the liquid film is accomplished on the whole surface of the substrate certainly. Therefore, for example, when a hydrophobic substrate is accommodated in a cup and subjected to a cleaning process, mist of the cleaning liquid rebounding from the cup adheres to the hydrophilic liquid film, so that particles contained in the mist are discharged from the substrate by a centrifugal force of the rotating substrate, together with the liquid film. Consequently, it is possible to prevent the particles from adhering to the substrate directly.

Preferably, the substrate cleaning apparatus further comprises a control unit that controls the operation of the substrate cleaning apparatus so that the liquid is supplied from the second liquid nozzle when the cleaning nozzle and the first liquid nozzle get access to the vicinity of the periphery of the substrate. It is possible to prevent the adhesion of mist rebounding from the cup. Additionally, if a rinsing liquid is used for the liquid, then it is possible to reduce a consumption of the rinsing liquid.

More preferably, the second liquid nozzle is adapted so as to supply the liquid to the center portion of the substrate.

In yet another embodiment, a substrate cleaning method comprises the steps of: ejecting a cleaning liquid onto a rotating substrate thereby cleaning the substrate; and supplying a liquid to form a liquid film on the substrate when the substrate is cleaned. In the above substrate cleaning method, the substrate is cleaned by ejecting the cleaning liquid while forming a hydrophilic liquid film on the substrate. Thus, even if an object to be processed is a hydrophobic substrate, it is possible to prevent particles from adhering to the substrate directly.

Preferably, in the substrate cleaning method, the cleaning liquid is a mixture fluid composed of inert gas and liquid, and is ejected from a cleaning nozzle.

More preferably, the cleaning nozzle is arranged to be movable above the rotating substrate in a radial direction thereof and while the cleaning is moving, the liquid is supplied closer to the center of the substrate than a substrate's position to which the cleaning liquid is ejected.

More preferably, the substrate cleaning method further comprises the step of starting to supply the liquid when the cleaning nozzle gets access to the vicinity of the periphery of the substrate.

A substrate processing system comprises: a coating section for coating resist on a substrate; a developing section for developing the substrate having the resist coated thereon; a heat processing section for applying a thermal treatment on the substrate; a substrate cleaning unit having a rotary holding part for holding the substrate rotatably, a cleaning nozzle arranged to be movable above the rotating substrate in the radial direction to eject a cleaning liquid and a liquid nozzle that supplies a liquid to form a liquid film on the substrate when the substrate is cleaned by the cleaning nozzle; and a transporting mechanism for transporting the substrate among the coating section, the developing section, the heat processing section and the substrate cleaning unit.

According to the above-mentioned constitution, in a photo-lithography process containing a resist coating step, a developing step, a heat processing step, etc., the substrate cleaning unit is incorporated into the coating section, the developing section and also the heat processing section. The transporting mechanism transfers the substrate among the respective sections and the cleaning unit. In this way, it is possible to improve a throughput of the substrate processing system.

BRIEF DESCRIPTION OF THE DRAWINGS

FIG. 1 is a plan view of a coater-and-developer system in accordance with one embodiment of the present invention;

FIG. 5 is a sectional view of the cleaning unit of FIG. 4, viewed from a direction X;

FIGS. 14A, 14B and FIG. 14C are diagrams showing combinations of respective values in case of changing the flow rate of the rinsing liquid, the moving speed of a rinse nozzle and the number of revolutions of a wafer between the center of the wafer and the periphery of the wafer;

FIG. 19 is a plan view showing the whole constitution of a cleaning system in accordance with one embodiment of the invention.

DESCRIPTION OF THE PREFERRED EMBODIMENT

Based on drawings, an embodiment of the present invention will be described below.

Figure 2:
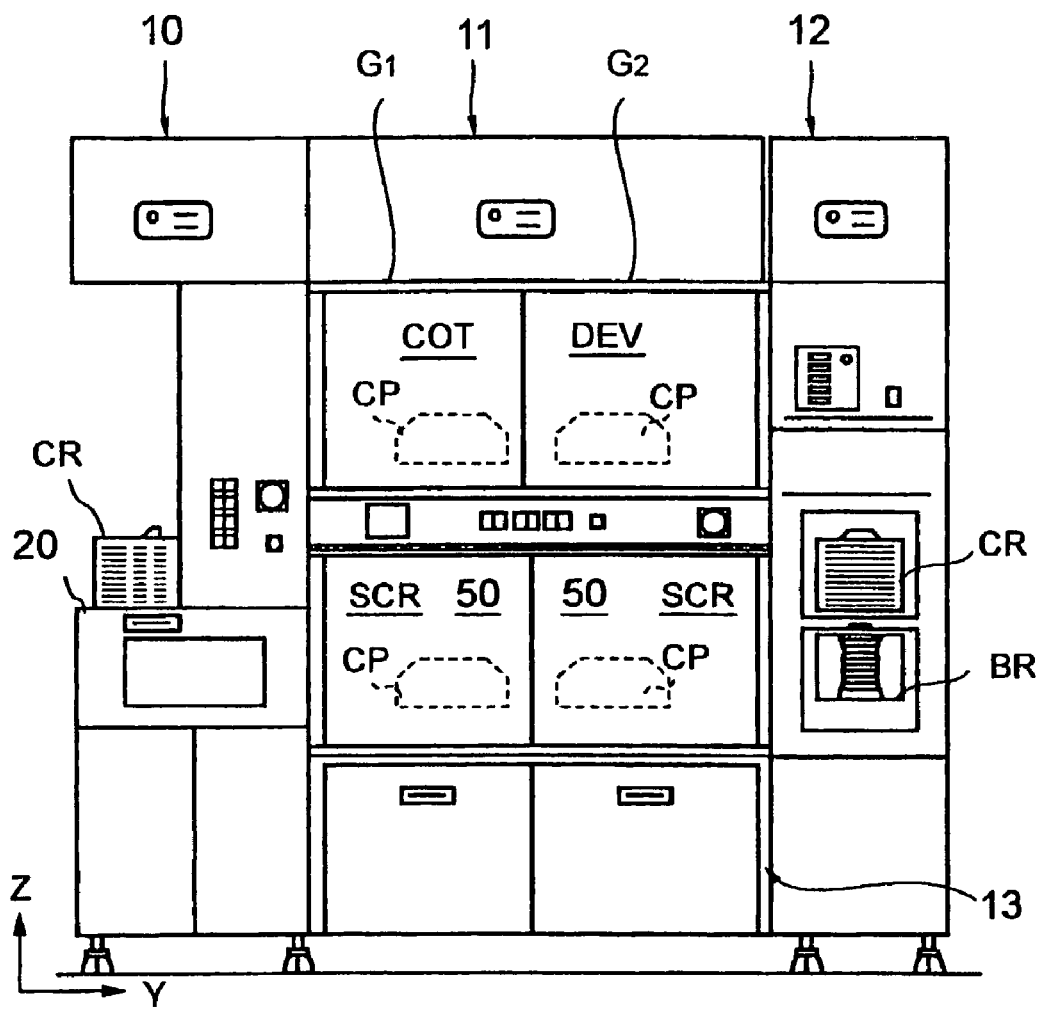
FIG. 2 is a front view of the coater-and-developer system of FIG. 1.
Figure 3:
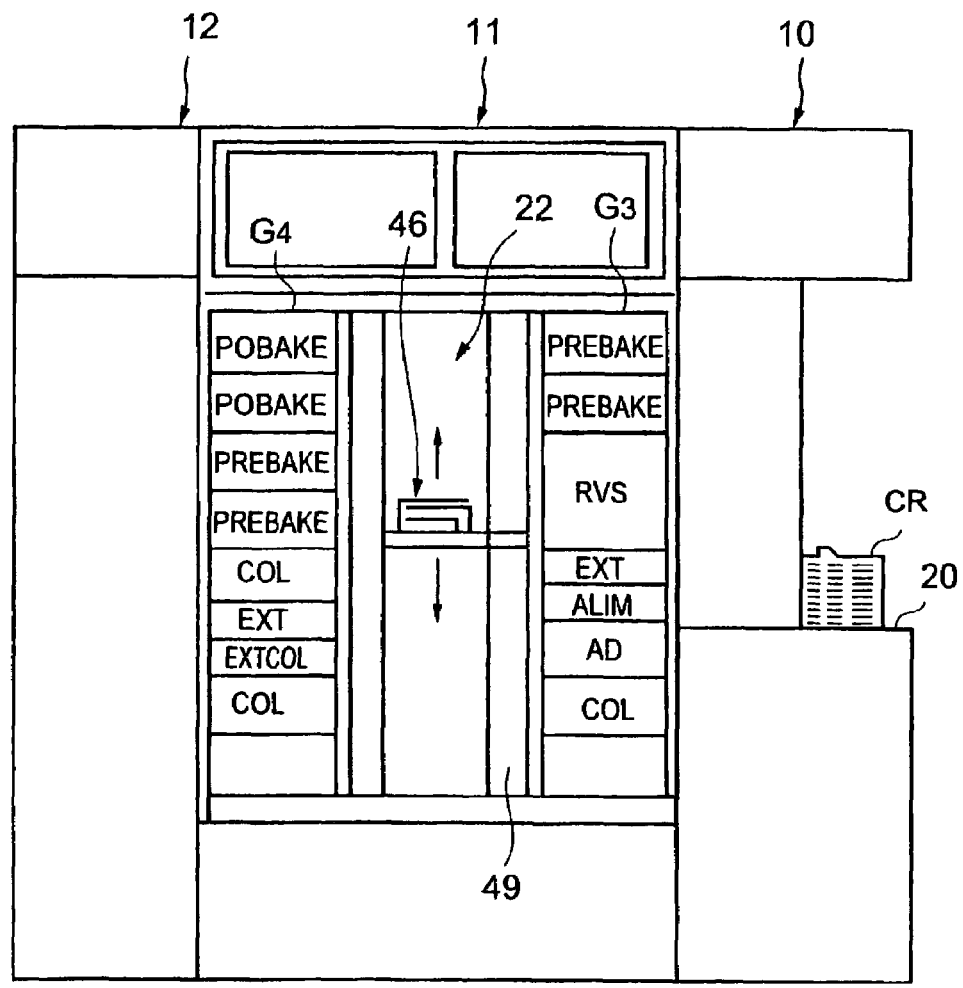
FIG. 3 is a rear view of the coater-and-developer system of FIG. 1.

FIGS. 1 to 3 are views showing the whole constitution of a coater-and-developer system in accordance with the present invention. In the figures, FIG. 1 is a plan view of the coater-and-developer system, FIG. 2 a front view of the same system and FIG. 3 is a rear view of the same system.

This coater-and-developer system 1 includes a cassette station 10, a processing station 11 connected with the station 10, and an interface section 12 connected with the station 11. In the cassette station 10, a plurality of semiconductor wafers W as the substrates to be processed, for example, twenty-five wafers W are loaded into the system 1 and unloaded therefrom by means of a wafer cassette CR. In the cassette station 10, it is also carried out to load and unload the wafers W into and from the wafer cassette CR.

In the processing station 11, a variety of single-wafer processing units are arranged in multistage at a designated position of the station 11. Each of the single-wafer processing units is adapted to apply a designated processing on the wafer W in a coating-and-developing process. The interface section 12 serves to deliver the wafers W from the processing station 11 to an optical aligner (or exposure unit, not shown) adjacent to the station 11, and vice versa.

In the cassette station 10, as shown in FIG. 1, a plurality of wafer cassettes (e.g. four cassettes) CR are arranged in respective positions of projections 20 a formed on a cassette mounting table 20. These wafer cassettes CR form a line along a direction of X while directing respective wafer ports of the cassettes CR toward the processing station 11. The cassette station 11 further includes a wafer transporting body 21 which is movable in an arrangement direction (X-direction) of the cassettes CR and also in another arrangement direction (Z-direction) of the wafers W in the cassette CR. The wafer transporting body 21 is capable of giving access to the wafer cassettes CR selectively. Further, the wafer transporting body 21 is rotatable in a direction of θ, admitting of access to an alignment unit (ALIM) and an extension unit (EXT) both included in a multistage unit of a later-mentioned third group G3 in the processing station 11.

As shown in FIG. 1, the processing station 11 is provided, at a center thereof, with a main wafer-transporting mechanism 22 of vertical-transfer type. Around the main wafer-transporting mechanism 22, there are arranged one or plural groups of processing units in multistage. In this example, the processing station 11 includes the processing units in multistage of five groups G1, G2, G3, G4 and G5. The first and the second groups of multistage units G1, G2 are juxtaposed on the front side of the system 1 (i.e. the lower side of FIG. 1). The third group of multistage unit G3 is adjacent to the cassette station 10. The fourth group of multistage unit G4 is adjacent to the interface section 12. The fifth group of multistage unit G5 is arranged on the rear side of the system 1. Noted that the fifth group of multistage unit G5 is movable along rails 25 for purpose of the maintenance of the main wafer-transporting mechanism 22.

The main wafer-transporting mechanism 22 is equipped, inside a cylindrical support 49, with a wafer transporting unit 46 which can move in a upward-and-downward direction of the system 1 (i.e. a direction of Z). The cylindrical support 49 is connected to a rotating shaft of a motor (not shown). Owing to a rotating force by this motor, the cylindrical support 49 rotates about the above rotating shaft as a rotating center, in one body with the wafer transfer unit 46. In this way, the wafer transfer unit 46 is adapted to be rotatable in the direction of θ.

In FIG. 2, the first group G1 includes two spinner-type processing units each of which applies a designated processing on a wafer W mounted on a spin chuck in a cup CP. For example, a resist coating unit (COT) and a cleaning unit 50 (as the substrate processing apparatus of the invention) are stacked up in two stages successively from the bottom. The second group G2 also includes two spinner-type processing units. For example, a developing unit (DEV) and another cleaning unit 50 similar to the cleaning unit 50 in the first group G1 are stacked up in two stages successively from the bottom. As shown in FIG. 3, the third group G3 includes oven-type processing units each performing a designated processing against a wafer W mounted in a mounting table.

For example, there are stacked up, in order from the bottom, a cleaning unit (COL), an adhesion unit (AD), an alignment unit (ALIM), an extension unit (EXT), a reverse unit (RVS) and pre-baking units (PREBAKE). Similarly, the fourth group G4 includes oven-type processing units. For example, there are stacked up, in order from the bottom, a cleaning units (COL) in two stages at an interval, an extension cleaning unit (EXTCOL), an extension unit (EXT), pre-baking units (PREBAKE) and post-baking units (POBAKE).

In this way, the cleaning units (COL, EXTCOL) of low processing temperature are arranged in lower stages of the group, while the pre-baking units (PREBAKE) and the post-baking units (POBAKE) are arranged in higher stages of the group. With this arrangement, it is possible to reduce a thermal interference among the processing units. Of course, the processing units may be stacked in multistage, at random.

In the direction of depth, the interface section 12 has a size equal to that of the processing station 11. In the direction of width, the interface section 12 is small-sized in comparison with the processing station 11. The interface section 12 is provided, on its front side, with a movable pickup cassette CR and an immovable buffer cassette BR in two stages. The interface section 12 further includes a wafer-edge exposure unit 23 on the rear side of the section 12 and a wafer transporter 24 at the center of the section 12. This wafer transporter 24 is movable in both of the directions X and Z, allowing of access to the cassettes CR, BR and also the wafer-edge exposure unit 23. The wafer transporter 24 is rotatable in the direction of θ, allowing of access to the extension unit (EXT) belonging to the multistage unit in the fourth group G4 in the processing station 11 and also a wafer delivery table (not shown) in the adjoining optical aligner.

Figure 4:
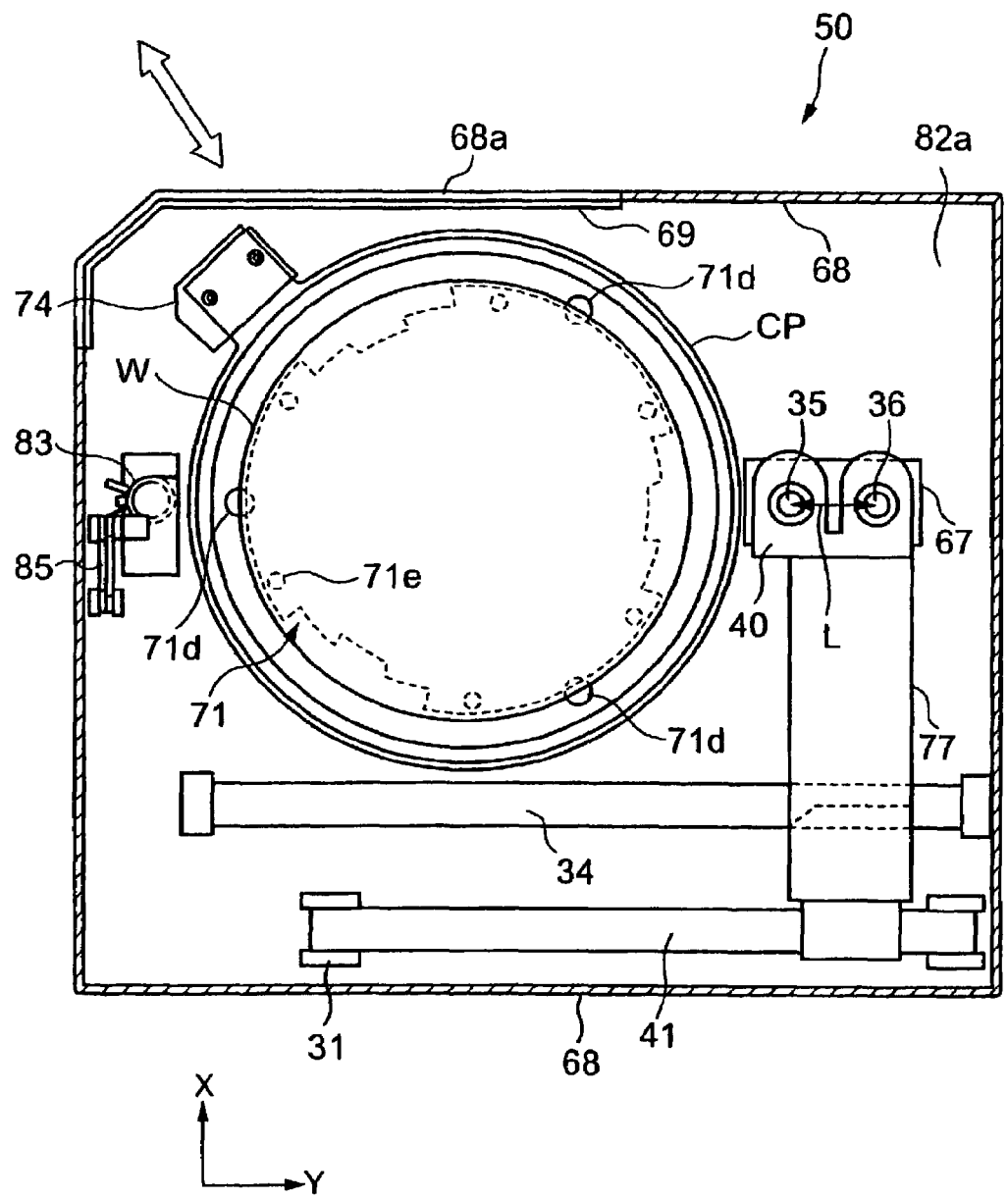
FIG. 4 is a plan view of a cleaning unit in accordance with one embodiment of the present invention.
Figure 6:
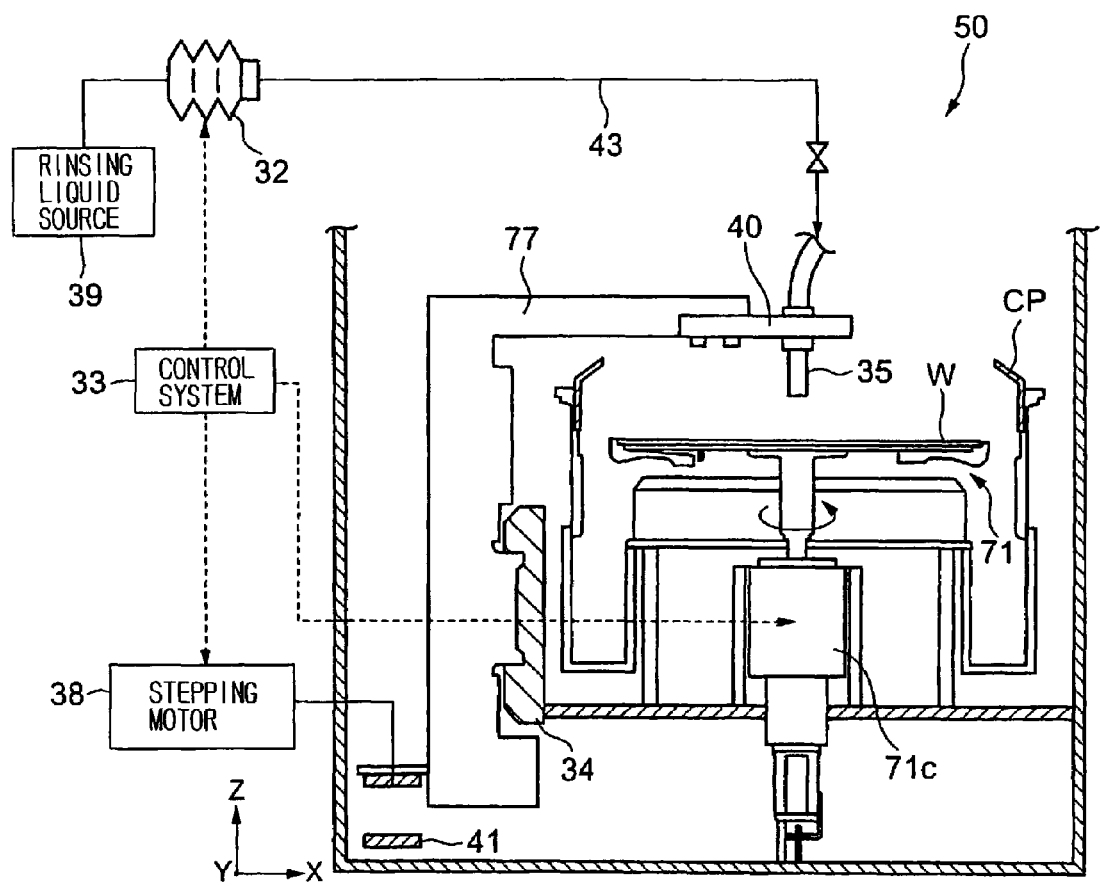
FIG. 6 is a sectional view of the cleaning unit of FIG. 4, viewed from a direction Y.

FIG. 4 is a plan view of the cleaning unit 50, showing its schematic structure. FIG. 5 is a sectional view of the unit 50, also viewed from the direction of X in FIG. 4. FIG. 6 is a sectional view of the unit 50, also viewed from the direction of Y in FIG. 4.

The cleaning unit 50 has a casing 68 provided with an opening 68a which allows a transfer arm of the main wafer-transporting mechanism 22 to transfer a wafer into and from the unit 50. The opening 68a is provided with a shutter member 69 having a closing mechanism.

Arranged in the center of the unit 50 is the above-mentioned cup CP which accommodates the wafer W so as to encircle the periphery of the wafer W. The cup CP is constructed to be movable up and down by a elevator mechanism 74. When delivering the wafer between the unit 50 and the main wafer-transporting mechanism 22, the cup CP is arranged in its lowered position. During the later-mentioned cleaning process, the cup CP is arranged in its raised position. Owing to this positioning, it is possible to prevent a cleaning liquid, which is in the form of mist produced during the cleaning process, from diffusing out of the cup CP.

In the cup CP, a spin chuck 71 is arranged to hold the wafer W for its rotation. The spin chuck 71 includes a chuck plate 71a, a pivot shaft 71b for supporting the chuck plate 71a, a motor 71c for rotating the pivot shaft 71b and detachable mechanisms 71d for attaching and detaching the wafer W in the chuck plate 71a. Support pins 71e (six pins in FIG. 4) are arranged on the surface of the chuck plate 71a. The wafer W is mounted on respective peaks of the support pins 71e. The motor 71c is adjustable in number of revolutions. For example, the number of revolutions of the motor 71c is variable within a range from 0 r.p.m. to 5000 r.p.m.

dynamically. The detachable mechanisms 71d for attaching and detaching the wafer W are arranged in three positions on the periphery of the chuck plate 71a. In FIG. 5, the detachable mechanism 71d on the left side is in a state of holding the wafer W, while the detachable mechanism 71d on the right side is in a state of releasing the wafer W. Below the chuck plate 71a, there is a sheet of connecting table 72 which is movable up and down by an elevator cylinder 79. Abutting jigs 72b are arranged at three positions on the connecting table 72 corresponding to the detachable mechanisms 71d respectively. When the elevator cylinder 79 raises the abutting jigs 72b, they come into abutment on the detachable mechanisms 71 and further press them, thereby releasing the wafer W, as shown with the detachable mechanism 71d on the right side in FIG. 5. To the contrary, when the abutting jigs 72b are lowered, the wafer W is held by not-shown elastic members, as shown with the detachable mechanism 71d on the left side in FIG. 5.

Inside the cap CP, a drain 75 is arranged on its bottom part to discharge an exhaust gas, a cleaning liquid and a rinsing liquid from the cup CP. As for this exhausting, the exhaust gas is discharged by a not-shown vacuum unit, for example. At a time of transferring the wafer W to or from the main wafer-transporting mechanism 22, it is carried out to weaken or stop the exhausting operation, whereby it is possible to prevent particles, which have been produced by mechanical actions of the mechanism 22 at the delivery of the wafer, from being sucked into the cup CP.

Beside the cup CP, both a first rinse nozzle 35 (as the first liquid nozzle) and a two-fluid nozzle 36 (as the cleaning nozzle) standing ready in a nozzle standby position 67 are fixed on a connecting member 40 integrally. A distance between the first rinse nozzle 35 and the two-fluid nozzle 36 ranges, for example, from 5 mm to 80 mm.

As shown in FIG. 6, the first rinse nozzle 35 is supplied with a rinsing liquid, for example, a deionized water (pure water) fed from a rinsing liquid source 39 via a supply pipe 43. Owing to the interposition of a bellows pump 32, it is possible to control the supply amount of the rinsing liquid out of the nozzle 35 dynamically. In this embodiment, the supply amount of the rinsing liquid is within a range from 0.5 l/min. to 1.2 l/min., for example.

Figure 7:
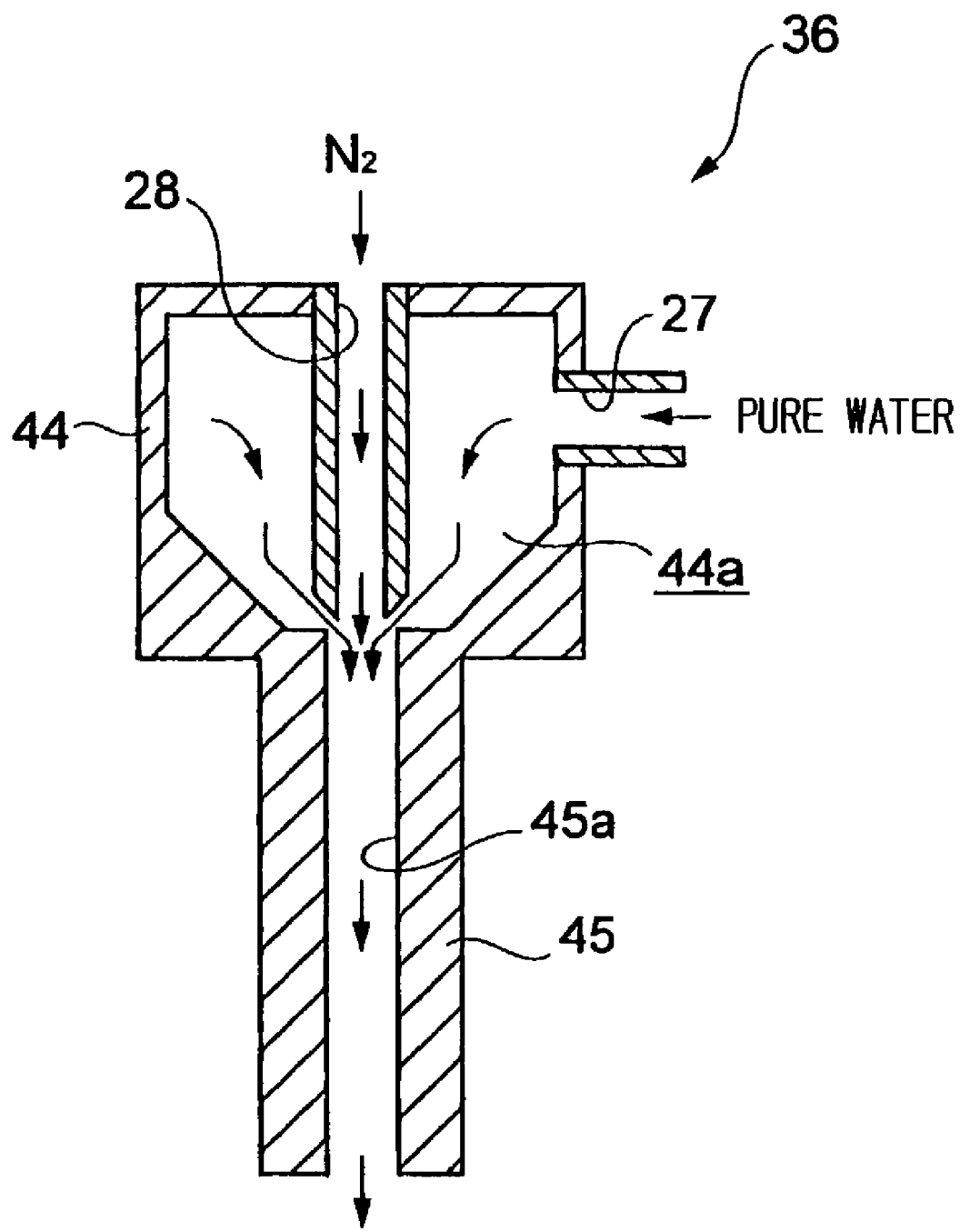
FIG. 7 is a sectional view of a two-fluid nozzle in accordance with one embodiment of the present invention.

The two-fluid nozzle 36 includes a buffer part 44 having a buffer chamber 44a formed therein and an ejecting part 45 for ejecting the cleaning liquid, as shown in FIG. 7. The buffer chamber 44a is provided with a nitrogen-gas passage 28 for supplying the buffer chamber 44a with e.g. nitrogen gas as an inert gas and a liquid passage 27 for supplying the deionized water. The ejecting part 45 has a passage 45a formed to eject a mixture fluid (i.e. deionized water including nitrogen gas) onto the wafer vigorously. Noted that the mixture fluid is obtained by mixing the nitrogen gas with the deionized water in the vicinity of an exit of the nitrogen-gas passage 28 in the buffer chamber 44a.

In FIG. 6, the connecting member 40 having the first rinse nozzle 35 and the two-fluid nozzle 36 fixed there on is attached to a nozzle holding arm 77 movable along a guide rail 34 extending in the direction of Y. The nozzle holding arm 77 is connected with a belt 44 driven by a stepping motor 38 through a drive pulley 31. Depending on a rotating speed of the stepping motor 38, it is possible to control a moving speed of the holding arm 77. Thus, the moving speed of the first rinse nozzle 35 and the two-fluid nozzle 36 are variable. According to the embodiment, the moving speed is within a range from 5 mm/sec to 10 mm/sec. Noted that the holding arm 77 is capable of moving up and down by a not-shown elevator mechanism, allowing the levels of the nozzles 35, 36 to be adjusted.

The number of revolutions of the motor 71, the displacement of the bellows pump 32 and the number of revolutions of the stepping motor 38 are all controlled by a control system 33. For example, it is possible to change an amount of the rinsing liquid supplied from the first rinse nozzle 35 dynamically, based on the moving speed of the holding arm 77. Further, it is possible to change the amount of the rinsing liquid dynamically, based on the number of revolutions of the motor 71c.

In an upper area outside the cup CP, there is arranged a second rinse nozzle 83 (as the second liquid nozzle,) which supplies the wafer W with a rinsing liquid, as similar to the first rinse nozzle 35. For example, a deionized water (pure water) is supplied from the second rinse nozzle 83. By a height-and-direction adjusting mechanism 85, the second rinse nozzle 83 is capable of changing its height in the direction of Z and an ejection angle of the rinsing liquid.

Here, the liquid nozzle supplies the same liquid as the cleaning liquid, for example, a deionized water (pure water) in this embodiment. When the cleaning liquid includes a chemical liquid, the supply of the same chemical liquid through the liquid nozzle takes effect of no variation in the concentration of the chemical liquid. When it is required to reduce the chemical concentration of the mist's adhesion substances to the cup, it is expected to use the deionized water or a chemical liquid having a concentration lower than that of the cleaning liquid. Further, the deionized water is employed as the rinsing liquid after cleaning the wafer.

Next, a series of processing steps in the coater-and-developer system 1 mentioned above will be described as follows.

First, in the cassette station 10, the wafer transporting body 21 gets access to the cassette CR mounted on the cassette mounting table 20 and accommodating wafers before processing. Then, the wafer transporting body 21 picks a piece of wafer W from the cassette CR and transports the wafer W to the alignment unit (ALIM). After performing the positioning of the wafer W at the alignment unit (ALIM), the main transporting mechanism 22 transports the wafer W to the reverse unit (RVS) where the wafer is turned over so that its back surface faces upward while the front surface for devices faces downward. Then, the wafer W is transported to the cleaning unit 50 and continuously, the back side of the wafer W is cleaning by the unit 50. Thereafter, the wafer W is transported to the reverse unit (RVS) again. In the reverse unit (RVS), the wafer W is turned over so that the front surface faces upward while the back surface faces downward. Then, the wafer W is transported to the cleaning unit 50 to perform a designated cleaning operation. This cleaning operation for the wafer W will be described later. As occasion demands, the cleaning operation of the front surface may be carried out in advance of the cleaning of the back surface Subsequently, the wafer is transported to the adhesion unit (AD) where a hydrophobic process is carried out. Next, a predetermined cooling process is performed by the cooling unit (COL). Thereafter, the wafer is transported to the resist coating unit (COT) where a rotational "resist" coating is carried out. At the prebaking unit (PREBAKE), a designated heating treatment is carried out and successively, the wafer is cooled down by the cooling unit (COL). Next, the wafer transporter 24 transports the wafer from the interface section 12 to the not-shown optical aligner where an exposure process is performed. After completing the exposure process, the wafer W is transported to the developing unit (DEV) for a developing process. Then, the wafer is returned to the cassette CR via the extension unit (EXT). Noted that after the developing process, there is a likelihood of heating process by the post baking unit (POBAKE).

Figure 8:
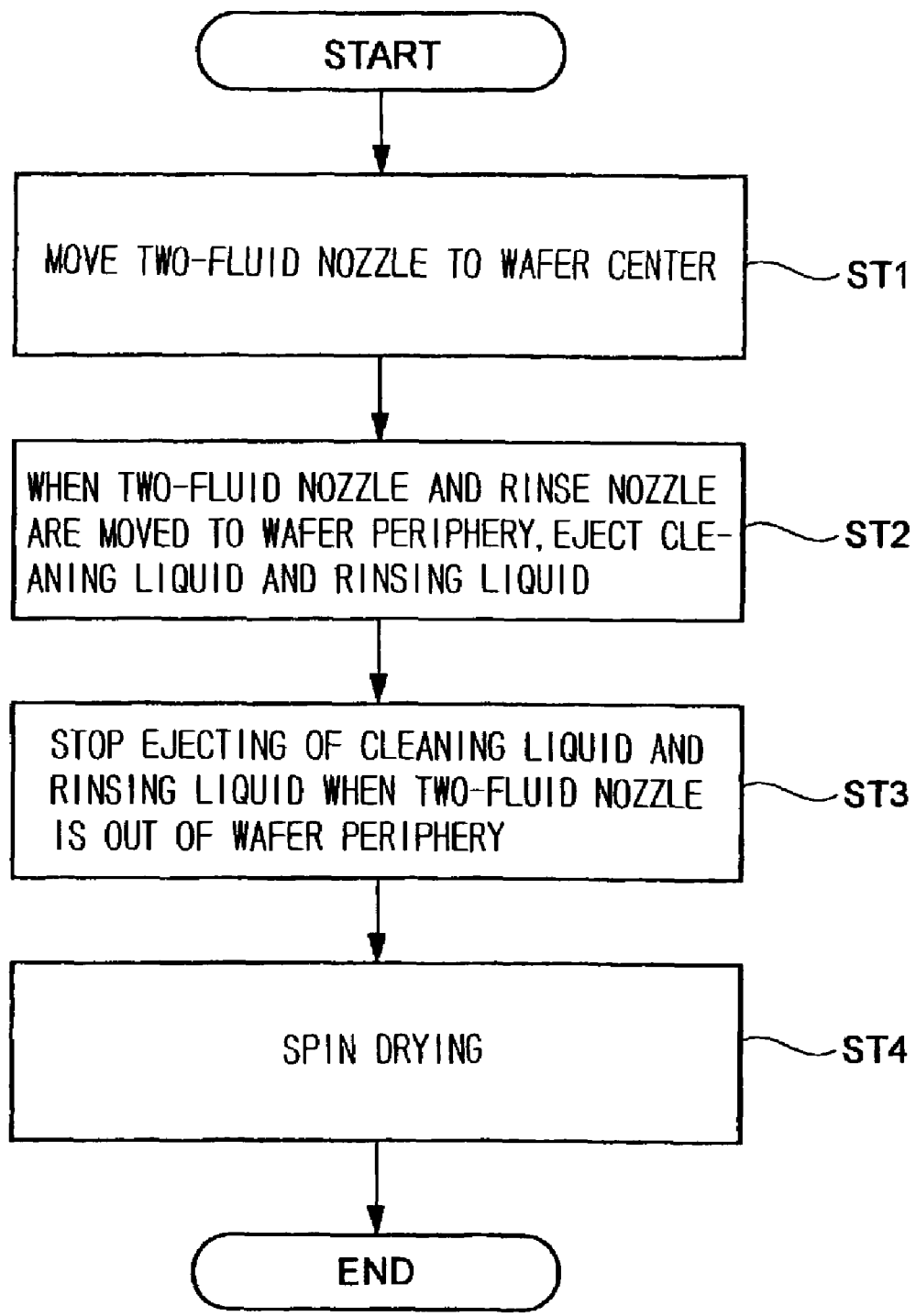
FIG. 8 is a flow chart showing a cleaning process in accordance with one embodiment of the present invention.

The cleaning process in the cleaning unit 50 will be described with reference to a flow chart of FIG. 8.

Figure 9A:
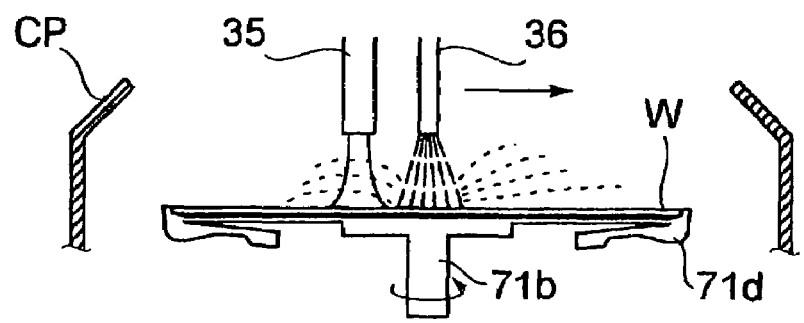
FIGS. 9A, 9B, 9C and FIG. 9D are side views showing the cleaning process of the embodiment, in order.

First, the wafer W is delivered to the spin chuck 71 and the cup CP is elevated so as to cover the periphery of the wafer W. Next, the two-fluid nozzle 36 and the rinse nozzle 35 are moved so that the two-fluid nozzle 36 takes a position above the center of the wafer W (step ST1). As shown in FIG. 9A, with the shown positions of the two-fluid nozzle 36 and the rinse nozzle 35, it is started to eject the cleaning liquid and the rinsing liquid and further move both of the nozzles toward the periphery of the wafer W in the radial direction (step ST2). Simultaneously, the wafer W starts to rotate. Noted that the beginning of rotation on the wafer W is not always simultaneous with the beginning of ejection of the cleaning liquid and the rinsing liquid. Thus, the rotation of the wafer W may be advanced from the ejection of the liquids.

Figure 9B:
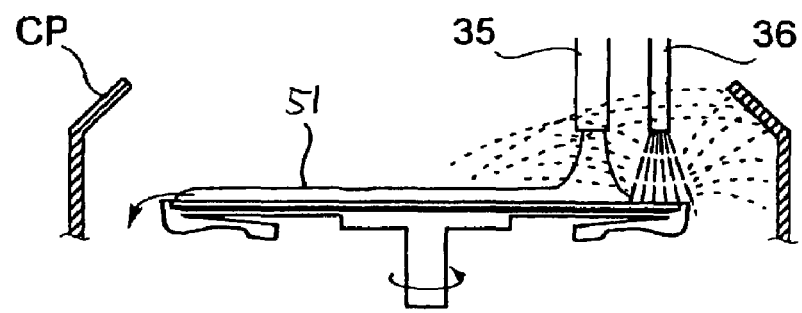

Next, as shown in FIG. 9B, when the two-fluid nozzle 36 moves to the vicinity of the periphery of the wafer W, the cleaning liquid spouted from the two-fluid nozzle 35 bounds back from the inside of the cup CP and scatters in the form of a mist toward the center of the wafer W. However, since the rinse nozzle 35 supplies the wafer W with the rinsing liquid to form a hydrophilic liquid film, namely, a water film 51 on the wafer W, the mist containing particles that have adhered to the cup CP adheres to the water film 51. Nevertheless, since the mist does not adhere to the wafer W but the water film 51, there is no fear of a bad influence on the wafer W. Further, owing to a centrifugal force of the rotating wafer W, the mist adhering to the water film 51 is discharged under the cup CP, together with the rinsing liquid, thereby raising no problem.

Figure 9C:
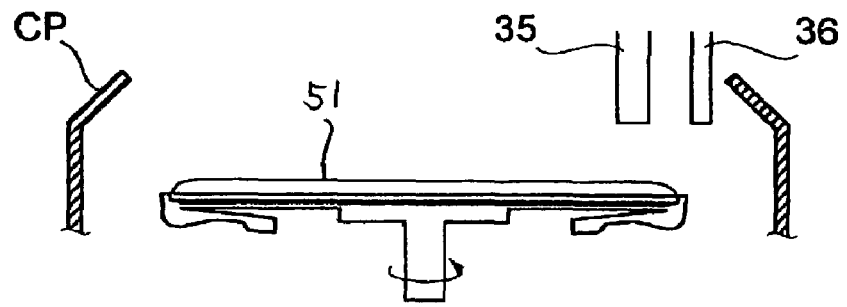
Figure 9D:
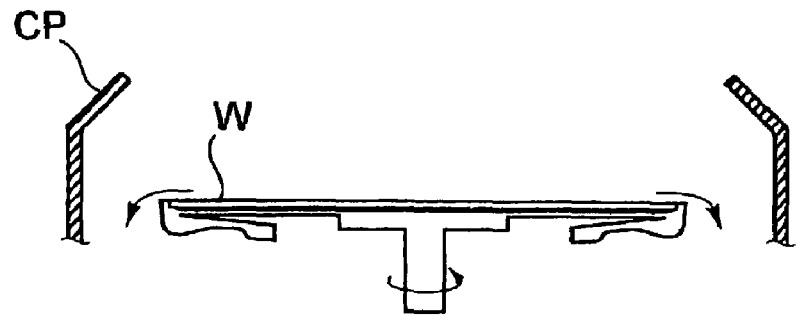

Thereafter, as shown in FIG. 9C, when the two-fluid nozzle 36 takes a position outside the periphery of the wafer W, it is carried out to stop ejecting the cleaning liquid and the rinsing liquid (step ST3) and continuously, both of the nozzles 35, 36 are arranged outside the cup CP. Next, as shown in FIG. 9D, the wafer W is rotated at e.g. 4000 r.p.m. to shake the liquid on the wafer off, thereby performing a drying process.

According to the embodiment, the flow rate of the rinsing liquid, the moving speed of both nozzles 35, 36 and the number of revolutions of the wafer W are respective constant values as follows.

| | |
|---|---|
| Flow rate of rinsing liquid | 1.0 l/min. |
| Moving speed of nozzles | 6 mm/sec |
| Number of revolutions of wafer | 1300 r.p.m. |

As for the number of revolutions, it may be established to be less or more than 1300 r.p.m. However, in case of the revolutions less than 300 r.p.m., it is impossible to form a liquid film on the whole surface of the hydrophobic wafer, causing a number of dewdrops to be scattered on the wafer. Therefore, the revolutions have to be more than 300 r.p.m.

As mentioned above, according to the embodiment, since the cleaning liquid is ejected to clean the wafer while forming the hydrophilic liquid film 51 on the wafer, it is possible to prevent the particles from adhering to the wafer however hydrophobic it may be.

Additionally, since the rinse nozzle 35 is arranged on a so-called "wafer-center" side of the two-fluid nozzle 36 moving and ejecting the cleaning liquid, thereby supplying the rinsing liquid to a position closer to the center of the wafer in comparison with a position to supply the cleaning liquid, the rinse nozzle 35 adjacent to the two-fluid nozzle 36 always supplies the periphery of the wafer with the rinsing liquid to form a liquid film even if the two-fluid nozzle 36 deviates from the periphery of the wafer outward. Thus, it is possible to prevent the particles from adhering to the wafer's periphery which is subjected to a lot of mist bounded from the cap CP particularly.

Figure 12:
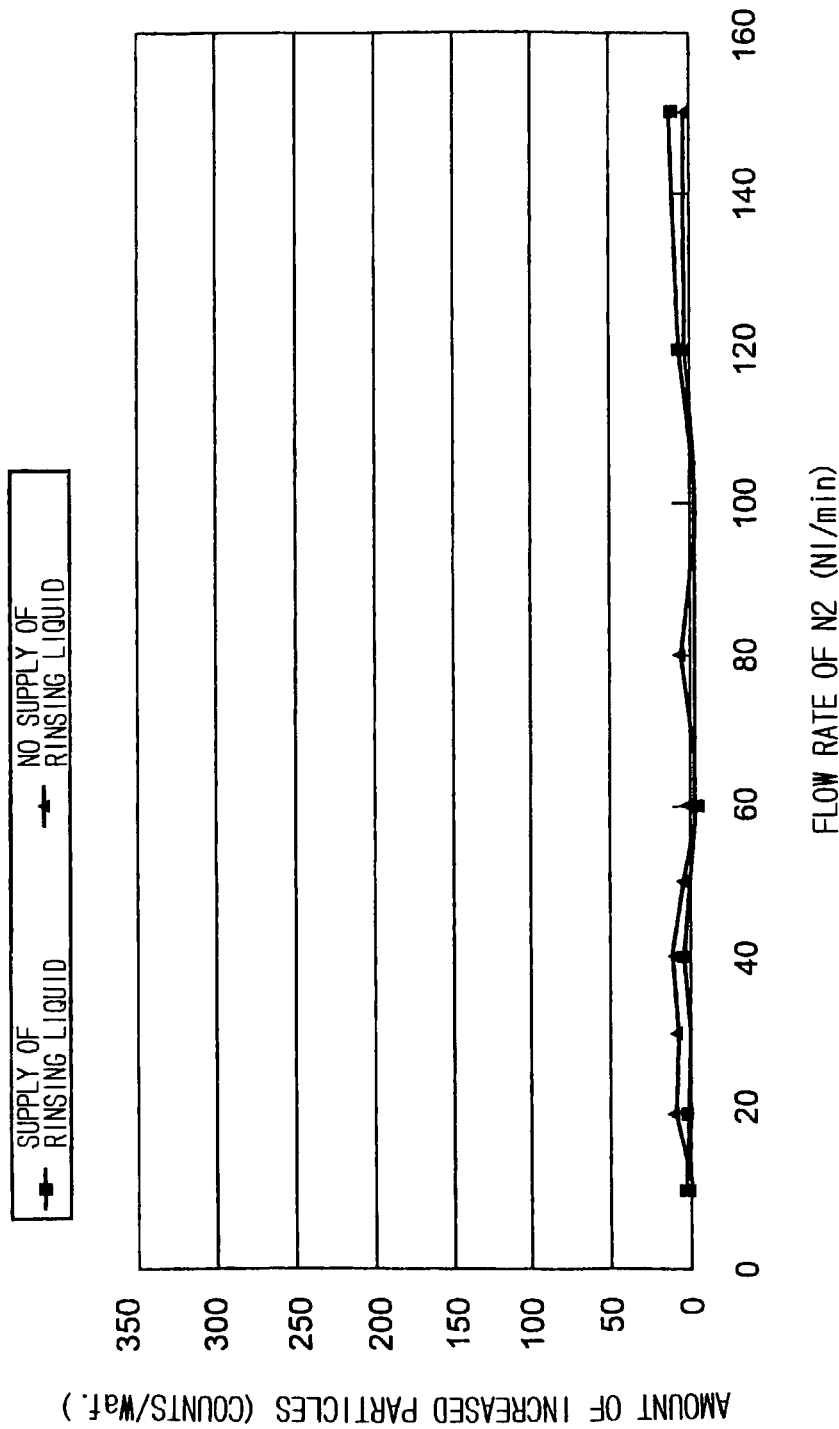
FIG. 12 is a diagram to compare particle increasing amount for the hydrophilic wafer depending on the existence of the rinsing liquid.
Figure 13:
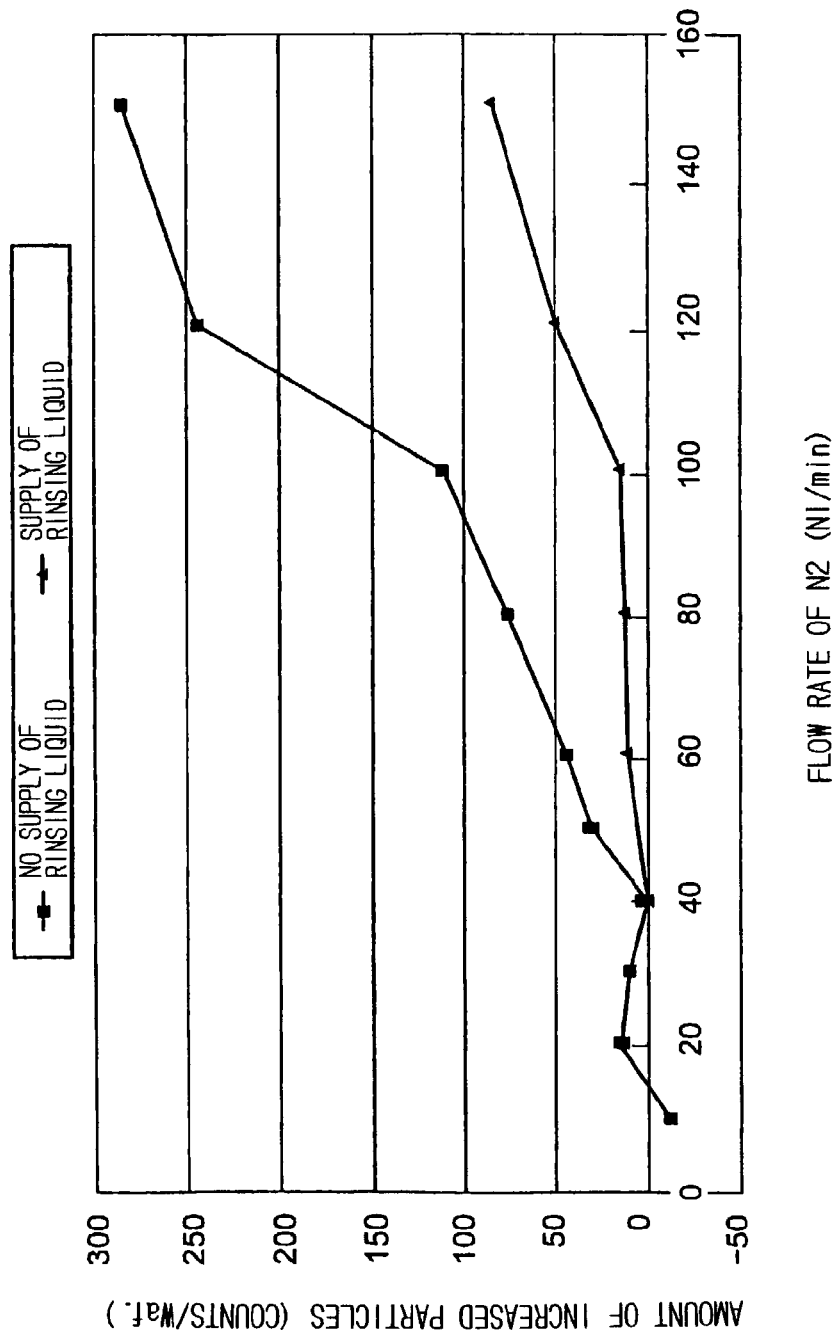
FIG. 13 is a diagram to compare particle increasing amount for the hydrophobic wafer depending on the existence of the rinsing liquid.

With reference to FIGS. 10 to 13, the cleaning process of this embodiment to form the liquid film of the rinsing liquid will be compared with the conventional cleaning process to perform only the ejection of the two-fluid cleaning liquid in terms of removal ratio of particles on a wafer (FIGS. 10 and 11) and an amount of particles increased on a wafer (FIGS. 12 and 13). Experiments were held for hydrophilic and hydrophobic wafers. In common with FIGS. 10 to 14, a horizontal axis designates a flow rate of nitrogen gas. An initial letter "N" of "Nl" represents a standard condition.

Figure 10:
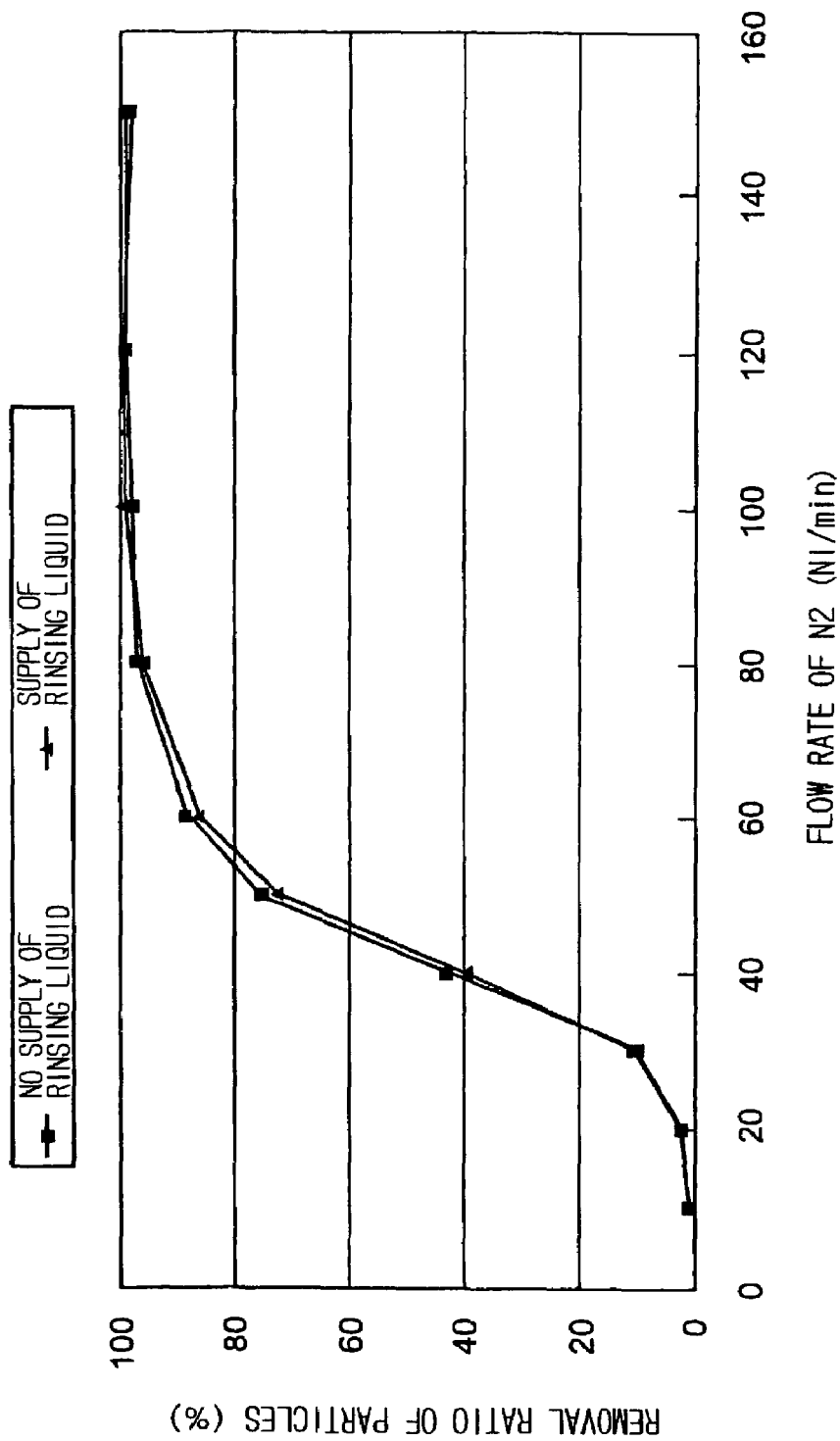
FIG. 10 is a diagram to compare particle removing percentage for a hydrophilic wafer depending on the existence of a rinsing liquid.
Figure 11:
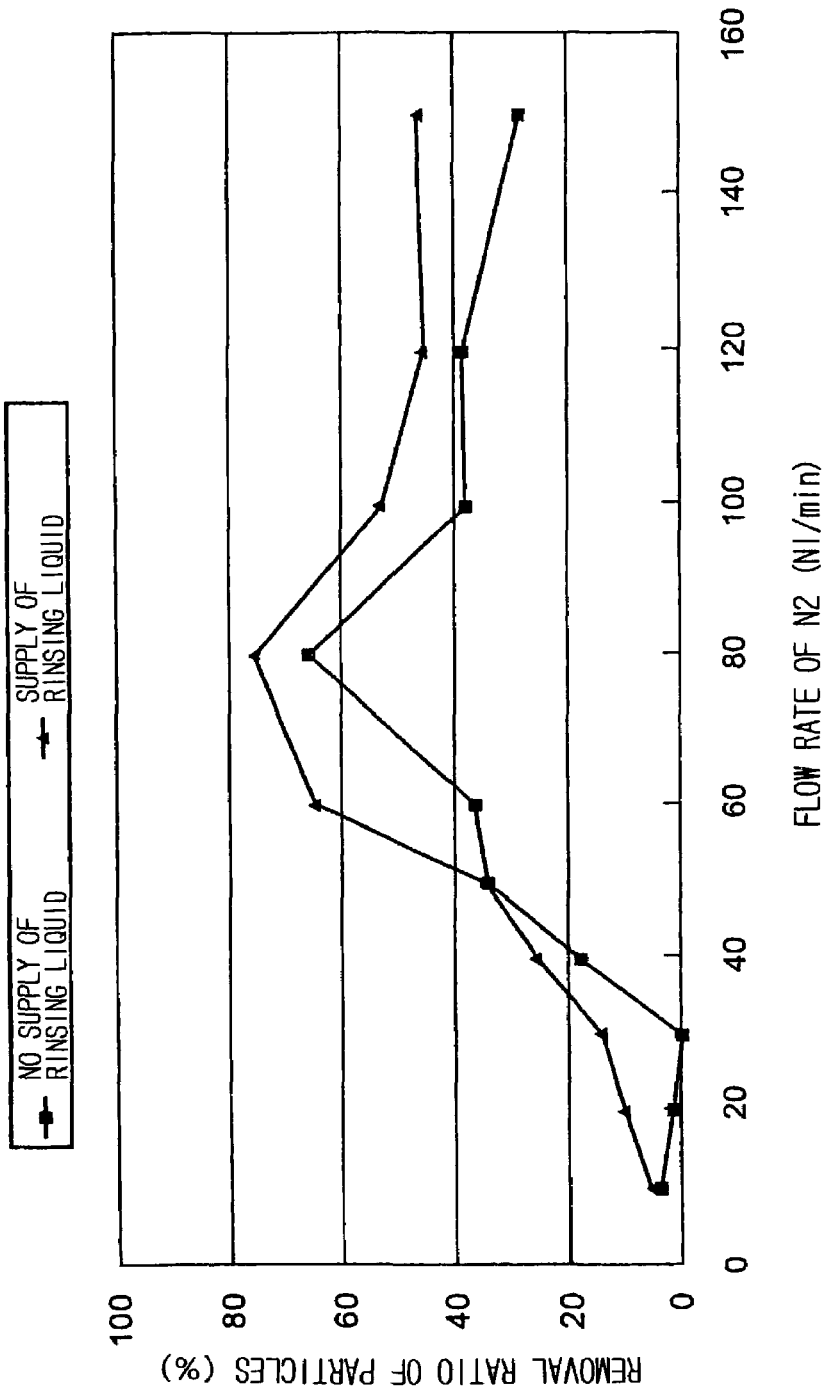
FIG. 11 is a diagram to compare particle removing percentage for a hydrophobic wafer depending on the existence of the rinsing liquid.

FIG. 10 shows the removal capability for the hydrophilic wafer. From the figure, it will be understood that the hydrophilic wafer exhibits the substantially same removal ratio irrespective of the presence of a rinsing liquid on supply. Thus, as for the hydrophilic wafer, there is no difference in the cleaning capability between the cleaning processes. While, in the hydrophobic wafer of FIG. 11, when the flow rate of nitrogen gas is more than 60 N l/min. particularly, the removal ratio of particles exhibits a remarkable difference between supply of rinsing liquid and no supply thereof. Consequently, it is preferable that the flow rate of nitrogen gas ranges from 60 N l/min. to 100 N l/min. Especially, it is found that the flow rate of 80 N l/min. provides the maximum removal ratio of particles.

Further, FIGS. 12 and 13 show increasing amounts of particles on one wafer with respect to various flow rates of nitrogen gas. Substantial contents shown in FIGS. 12 and 13 are similar to those of FIGS. 10 and 11, respectively. With reference to FIG. 14, the operation in altering the flow rate of the rinsing liquid, the moving speed of the rinse nozzle 35 (moving speed of the two-fluid nozzle) or the number of revolutions of the wafer W while the rinse nozzle 35 is moving above the wafer W will be described.

For example, when the flow rate of the rinsing liquid is variable while the moving speed of the rinse nozzle 35 and the number of revolutions of the wafer W are respectively constant, it is carried out to make the flow rate of the rinsing liquid supplied to the periphery of the wafer W larger than the flow rate of the rinsing liquid supplied to the center of the wafer W. For example, as shown in FIG. 14A, there is presented a processing condition of 0.5 l/min. at the center and 1.2 l/min. at the periphery. In this case, the circumferential speed of the wafer W has a difference between its center and the periphery. Nevertheless, this establishment of the flow rate of the rinsing liquid allows an amount of the rinsing liquid supplied onto the center of the wafer per unit time to be equal to an amount of the rinsing liquid supplied onto the periphery of the wafer per unit time. Noted that the amount of the rinsing liquid on supply may be changed in two stages in the moving course of the rinse nozzle 35. Alternatively, the amount may be gradually changed from 0.5 l/min. to 1.2 l/min. in three or more stages.

Next, when the moving speed of the rinse nozzle 35 is variable while the supply amount of the rinsing liquid and the number of revolutions of the wafer W are respectively constant, it is carried out to make the speed of the rinse nozzle 35 in supplying the periphery of the wafer W with the rinsing liquid smaller than the speed of the rinse nozzle 35 in supplying the center of the wafer W with the rinsing liquid. For example, as shown in FIG. 14B, there is presented a processing condition of 7 mm/sec at the center of the wafer W and 5 mm/sec at the periphery. Also in this case, the circumferential speed of the wafer W has a difference between its center and the periphery. Nevertheless, this establishment of the moving speed of the rinse nozzle 35 allows an amount of the rinsing liquid supplied onto the center of the wafer per unit time to be equalized to an amount of the rinsing liquid supplied onto the periphery of the wafer per unit time, as possible. Noted that the moving speed of the rinse nozzle 35 may be changed in two stages in its moving course. Alternatively, the speed may be gradually changed from 7 mm/sec to 5 mm/sec in three or more stages.

Next, when the number of revolutions of the wafer W is variable while the moving speed of the rinse nozzle 35 and the supply amount of the rinsing liquid are respectively constant, it is carried out to make the number of revolutions of the wafer in supplying the periphery of the wafer W with the rinsing liquid smaller than the number of revolutions of the wafer in supplying the center of the wafer W with the rinsing liquid. For example, as shown in FIG. 14C, there is presented a processing condition of 1500 r.p.m. at the center of the wafer W and 1000 r.p.m. at the periphery. By this establishment of revolutions, it is possible to equalize an amount of the rinsing liquid supplied onto the center of the wafer per unit time with an amount of the rinsing liquid supplied onto the periphery of the wafer per unit time, as possible. Noted that the number of revolutions of the wafer W may be changed in two stages in the moving course of the rinse nozzle 35. Alternatively, the number of revolutions may be gradually changed from 1500 r.p.m. to 1000 r.p.m. in three or more stages.

As mentioned above, by allowing the flow rate of the rinsing liquid, the moving speed of the rinse nozzle 35 and the number of revolutions of the wafer to be dynamically variable in the moving course of the rinse nozzle 35, it is possible to equalize the cleaning capability of the unit throughout the whole wafer.

Next, with reference to FIGS. 15 to 18, the cleaning process employing the second rinse nozzle 83 will be described.

Figure 15:
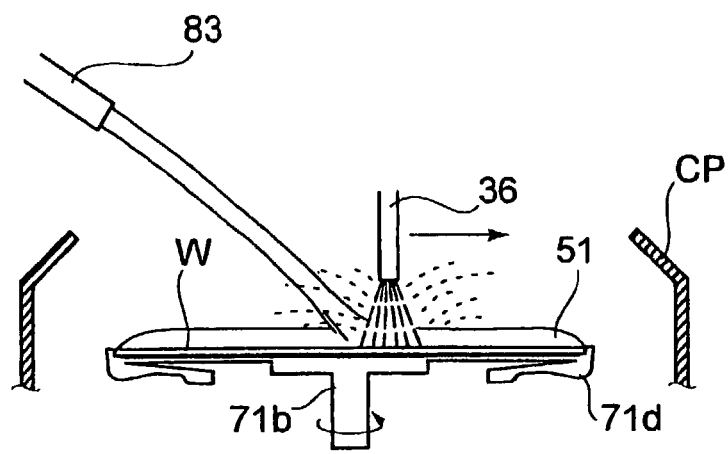
FIG. 15 is a side view of a cleaning unit employing the two-fluid nozzle and a second rinse nozzle.

In FIG. 15, without using the first rinse nozzle 35, only the two-fluid nozzle 36 ejects the cleaning liquid while moving from the center of the wafer W to the periphery in the radial direction. Simultaneously, the second rinse nozzle 83 supplies the rinsing liquid to a designated position, for example, the center of the wafer W to form the liquid film 51 on the wafer W. Consequently, it is possible to prevent so-called "rebounding mist from cup", which is generated due to the two-fluid nozzle 36 moving to the periphery of the wafer, from adhering to the wafer W directly.

Figure 16A:
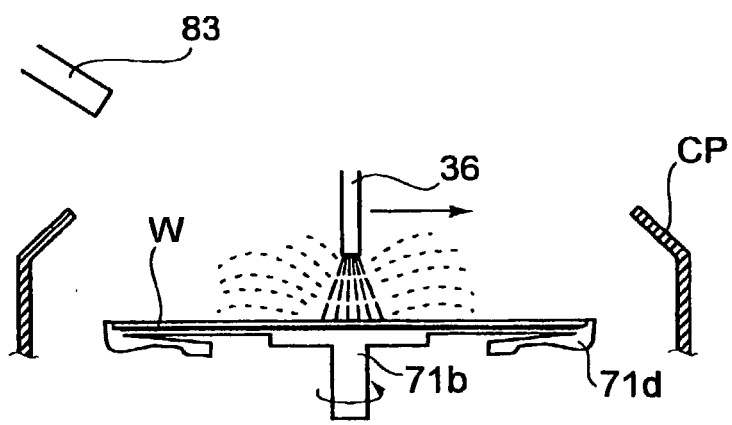
FIGS. 16A and 16B are side views of two conditions of the cleaning unit of FIG. 15 before and after supplying a rinsing liquid on the way of the two-fluid nozzle.
Figure 16B:
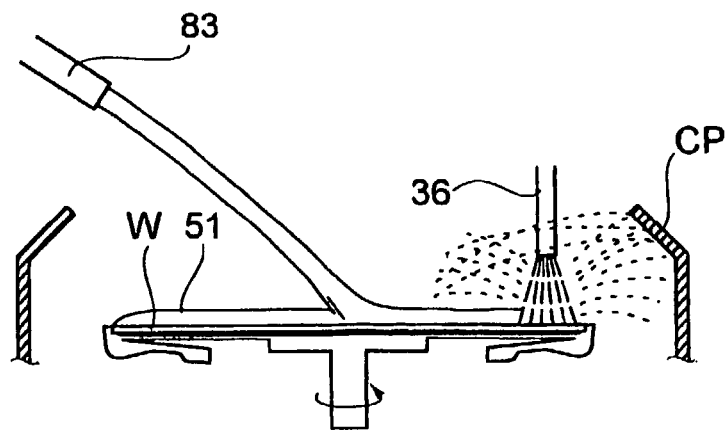

In common with the arrangements of FIGS. 16A and 16B, the first rinse nozzle 35 is not employed. First, as shown in FIG. 16A, the two-fluid nozzle 36 is moved from the center of the wafer W to the periphery while ejecting the cleaning liquid to the center of the wafer W firstly. At a point of this time, the second rinse nozzle 83 does not eject the rinsing liquid yet. This is because there is less possibility of rebounding of the cleaning liquid from the cup CP at a point of time when the two-fluid nozzle 36 starts to eject the cleaning liquid to the center of the wafer W, as shown in FIG. 16A. Subsequently, as shown in FIG. 16B, when the two-fluid nozzle 36 gets access to the vicinity of the periphery of the wafer W, it is executed to supply the rinsing liquid, thereby forming the liquid film 51 on the wafer W. This is because such a positioning of the two-fluid nozzle 36 causes the rebounding mist to be increased. Therefore, it is possible to prevent the adhesion of the rebounding mist and also possible to reduce a consumption of the rinsing liquid in comparison with the case of FIG. 15.

Figure 17A:
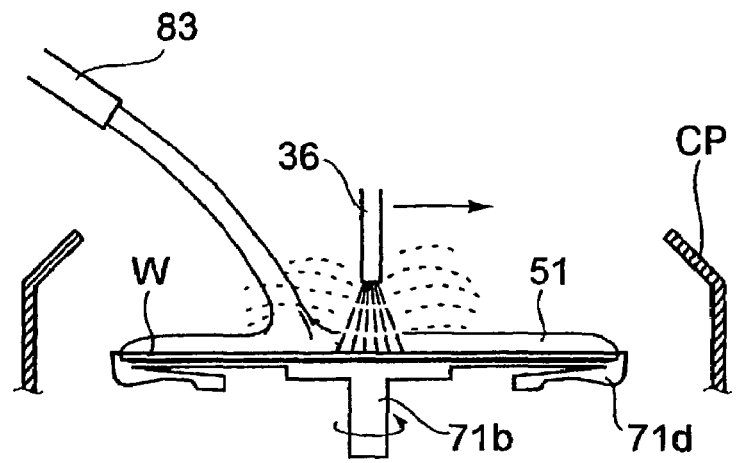
FIGS. 17A and 17B are side views in case of changing an ejection angle of the two-fluid nozzle.
Figure 17B:
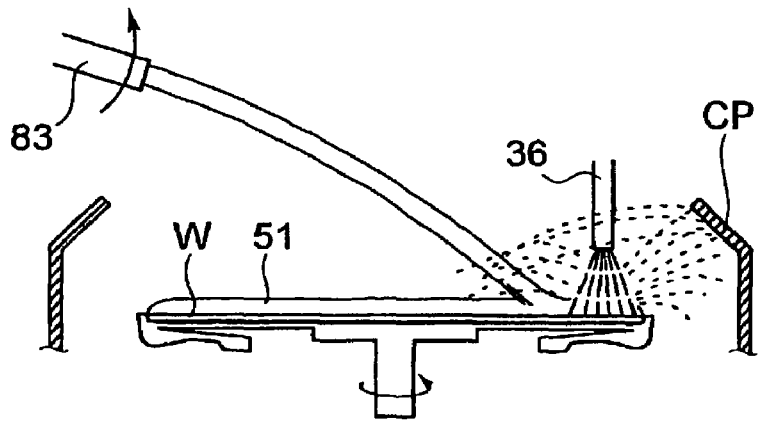

In common with the arrangements of FIGS. 17A and 17B, the first rinse nozzle 35 is not employed. First, as shown in FIG. 17A, the two-fluid nozzle 36 ejecting the cleaning liquid is moved from the center of the wafer W to the periphery and simultaneously, the liquid film 51 is formed by the rinsing liquid. As shown in FIG. 17B, when the two-fluid nozzle 36 reaches the periphery of the wafer, an angle of the second rinse nozzle 83 to eject the rinsing liquid is changed so as to supply the rinsing liquid to the vicinity of the periphery of the wafer in accordance with the position of the cleaning liquid on supply. Consequently, it is possible to prevent the adhesion of mist to the periphery of the wafer more certainly.

Figure 18:
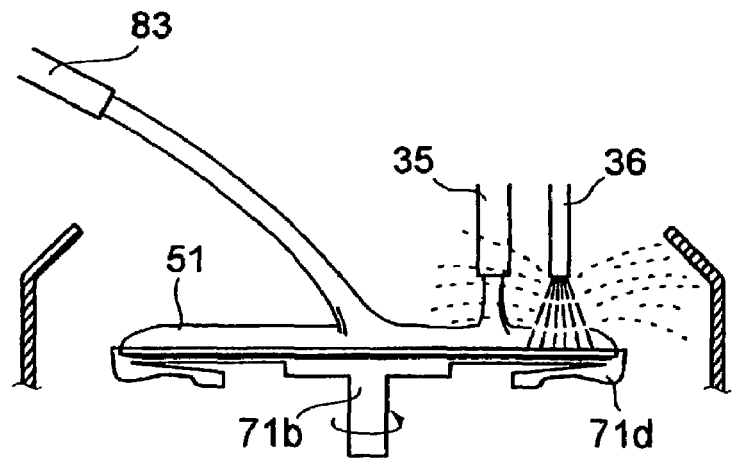
FIG. 18 is a side view in case of using a first rinse nozzle and a second rinse nozzle.

In accordance with the arrangement of FIG. 18, both of the first rinse nozzle 35 and the second rinse nozzle 83 are used. In this case, the two-fluid nozzle 36 and the first rinse nozzle 35 move from the center of the wafer to the periphery. Additionally, the second rinse nozzle 83 supplies the rinsing liquid. Consequently, it is possible to form the liquid film 51 on the whole surface of the wafer W certainly, whereby the adhesion of mist can be prevented certainly.

Figure 20:
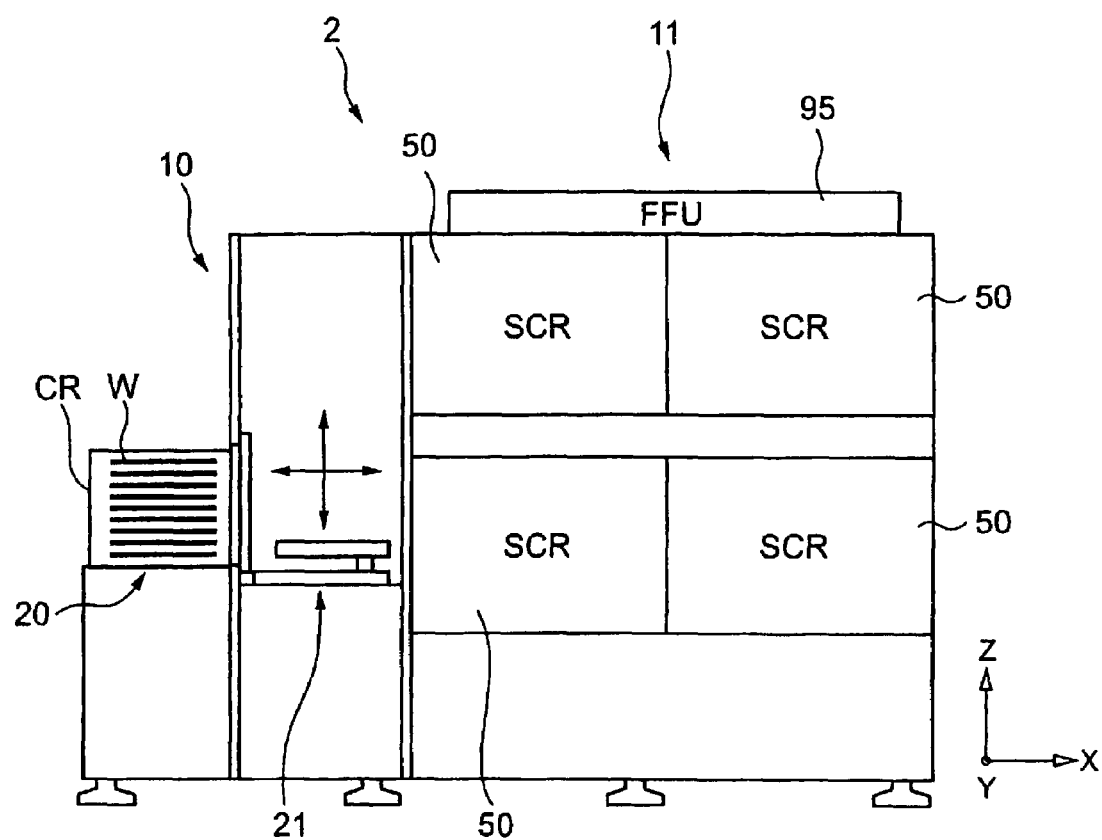
FIG. 20 is a front view showing the whole constitution of the cleaning system of FIG. 19.

FIG. 19 is a plan view showing the whole constitution of a cleaning system in accordance with one embodiment of the invention. FIG. 20 is a front view of the above cleaning system. In FIGS. 19 and 20, elements similar to those of FIGS. 1 and 2 are indicated with the same reference numerals respectively and their overlapping descriptions are eliminated.

On the front side of the processing station 11, there are four cleaning units 50 for cleaning the wafer W. The main wafer transporting mechanism 22 is arranged at the center of the station 11. Being adjacent to the mechanism 22, there are arranged one combination 91 of a heat-processing unit (HP) necessary for drying the wafer after cleaning and a cooling unit (COL) and another combination 90 of a transition unit (TRS) for delivering the wafer between the cassette station 10 and the processing station 11 and a reverse unit (RVS) for turning the wafer W upside down. On the rear side of the processing station 11, there are arranged an electric unit (EB) 93 and mechanical control unit (MB) 94 for controlling the whole operation of the cleaning system 2 and a chemical storing unit (CTB) 92 for storing a designated cleaning liquid used in the cleaning units 50. The processing station 11 further includes a fan filter unit (FFU) 95 for allowing fresh air to flow from a ceiling part of the station 11 downwardly.

The cleaning system 2 mentioned above may be used as an exclusive cleaning system for a process except the coater-and-developer system 1. As the process except the coater-and-developer process, for example, there exist a CVD process to supply the wafer W with a specified gas or several sorts of compound gases thereby forming a desired thin film by a chemical reaction on the wafer W, an etching process for etching the whole surface of a thin film formed on the wafer W or a specified area of the thin film by a required thickness and so on. Thus, the cleaning system 2 may be used to clean wafers contaminated during the CVD process or the etching process.

Noted that the cleaning system 2 has been described in the form of a single system in this embodiment. In the modification, the same cleaning system 2 may be used as an inline-type complex unit to be connected with a CVD unit for the above CVD process or an etching unit for the above etching process through an interface unit etc.

The present invention is not limited to the above-mentioned embodiment only and therefore, various modifications will be made.

For example, as for the cleaning process of FIG. 9A, the ejection of the rinsing liquid via the rinse nozzle 35 may be abolished when the two-fluid nozzle 36 is started to eject the cleaning liquid to the center of the wafer W. Also in this case, when the two-fluid nozzle 36 reaches the periphery of the wafer W (see FIG. 9B), the "cup" rebounding mist will be increased. Then, the rinsing liquid may be supplied, as similar to the operation of FIGS. 16A and 16B. This is because there is less possibility of rebounding of the cleaning liquid from the cup CP at a point of time when the two-fluid nozzle 36 starts to eject the cleaning liquid to the center of the wafer W and because the rebounding mist from cup becomes easy to be generated when the two-fluid nozzle 36 reaches the vicinity of the periphery of the wafer.

Although the rinse nozzle 83 supplies the center of the wafer with the rinsing liquid in FIGS. 15, 16A, 16B and 18, a target for the rinsing liquid is not limited to only the center of the wafer unless the position of the target interferes with the cleaning liquid through the two-fluid nozzle 36.

Further, a semiconductor wafer is employed as the substrate in the above-mentioned embodiment. Without being limited to the semiconductor wafer, the present invention is also applicable to a glass substrate used for a liquid crystal display etc.

As mentioned above, according to the present invention, it is possible to prevent adhesion of particles due to the generation of mist irrespective of the substrate being hydrophilic or hydrophobic, thereby improving the cleaning capability of the apparatus.

What is claimed is:

1. A substrate cleaning method comprising the steps of:
    ejecting a cleaning liquid by a cleaning nozzle onto a rotating substrate within a cup for preventing the cleaning fluid from scattering away while moving the cleaning nozzle in the radial direction of the substrate from a center of the substrate to a periphery of the substrate, thereby cleaning the substrate;
    supplying a second liquid onto the substrate by a first liquid nozzle in the radial direction of the substrate simultaneously with supplying of the cleaning liquid by the cleaning nozzle when the substrate is cleaned by the cleaning nozzle, thereby forming a liquid film on the substrate, the second liquid supplied onto the substrate by the first liquid nozzle is supplied closer to a rotating center of the substrate than the cleaning nozzle; and
    supplying the second liquid onto the rotating center of the substrate by a second liquid nozzle when the cleaning nozzle and the first liquid nozzle get access to a vicinity of a periphery of the substrate, thereby forming the liquid film on the substrate together with the first liquid nozzle.

2. A substrate cleaning method as claimed in claim 1, wherein
    the cleaning liquid is a mixture fluid composed of inert gas and a first liquid.

3. A substrate cleaning method as claimed in claim 1, wherein the cleaning liquid is a chemical liquid or pure water.

4. A substrate cleaning method as claimed in claim 3, wherein the second liquid is pure water.

5. A substrate cleaning method as claimed in claim 3, wherein the second liquid is a chemical liquid when the cleaning liquid is a chemical liquid, and the chemical liquid of the second liquid has a concentration lower than that of the chemical liquid of the cleaning liquid.

6. A substrate cleaning method as claimed in claim 3, wherein the second liquid is a chemical liquid when the cleaning liquid is a chemical liquid, and the chemical liquid of the second liquid has a concentration the same as that of the chemical liquid of the cleaning liquid.

7. A substrate cleaning method as claimed in claim 1, wherein the first liquid nozzle is moved in one body with the cleaning nozzle.

8. A substrate cleaning method as claimed in claim 7, wherein a distance between the cleaning nozzle and the first liquid nozzle ranges from 5 mm to 80 mm.

9. A substrate cleaning method as claimed in claim 7, wherein a flow rate of the second liquid supplied to the periphery of the substrate by the first liquid nozzle becomes more than a flow rate of the second liquid supplied to the center of the substrate by the second liquid nozzle.

10. A substrate cleaning method as claimed in claim 1, wherein a flow rate of the second liquid supplied by the first liquid nozzle ranges from 0.5 l/mm. to 1.2 l/mm.

11. A substrate cleaning apparatus comprising:
a holding part for holding a substrate rotatably;
a two-fluid cleaning nozzle for ejecting a mixture fluid composed of a gas and a first liquid to the substrate for cleaning the substrate, the two-fluid cleaning nozzle having formed therein a first passage for said gas and a second passage for said first liquid, the two-fluid cleaning nozzle being movable above the substrate in the radial direction of the substrate from a center of the substrate to a periphery of the substrate while the substrate is rotating;
a cup for accommodating the substrate and for preventing the mixture fluid from scattering away;
a first liquid nozzle arranged to be movable in the radial direction of the substrate from the center of the substrate to the periphery of the substrate in one body with the two-fluid cleaning nozzle moving, the first liquid nozzle supplying a second liquid onto the substrate when the substrate is cleaned by the two-fluid cleaning nozzle, thereby forming a liquid film on the substrate, the first liquid nozzle and the two-fluid cleaning nozzle being disposed such that the second liquid supplied onto the substrate by the first liquid nozzle is supplied closer to a rotating center of the substrate than the mixture fluid ejected by the two-fluid cleaning nozzle;
a second liquid nozzle which supplies the second liquid to the rotating center of the substrate when the substrate is cleaned by the two-fluid cleaning nozzle, thereby forming the liquid film on the substrate together with the first liquid nozzle; and
a control unit that controls the operation of the substrate cleaning apparatus so that the mixture fluid supplied by the two-fluid cleaning nozzle and the second liquid supplied by the first liquid nozzle are supplied to the substrate simultaneously while the cleaning nozzle and the first liquid nozzle are moved in the radial direction of the substrate from the center of the substrate to the periphery of the substrate, and the second liquid is supplied to a center portion of the substrate from the second liquid nozzle when the cleaning nozzle and the first liquid nozzle get access to a vicinity of a periphery of the substrate.

12. A substrate cleaning apparatus as claimed in claim 11, wherein the first liquid is a chemical liquid or pure water.

13. A substrate cleaning apparatus as claimed in claim 12, wherein the second liquid is pure water.

14. A substrate cleaning apparatus as claimed in claim 12, wherein the second liquid is a chemical liquid when the first liquid is a chemical liquid, and the chemical liquid of the second liquid has a concentration lower than that of the chemical liquid of the first liquid.

15. A substrate cleaning apparatus as claimed in claim 12, wherein the second liquid is a chemical liquid when the first liquid is a chemical liquid, and the chemical liquid of the second liquid has a concentration the same as that of the chemical liquid of the first liquid.

16. A substrate cleaning apparatus, comprising:
a holding part for holding a substrate rotatably;
a cleaning nozzle for ejecting a cleaning liquid to the substrate, the cleaning nozzle being movable above the substrate in the radial direction of the substrate from a center of the substrate to a periphery of the substrate while the substrate is rotating, the cleaning nozzle further being movable from a center of the substrate to a periphery of the substrate;
a cup for accommodating the substrate and for preventing the cleaning fluid from scattering away;
a first liquid nozzle arranged to be movable in the radial direction of the substrate from the center of the substrate to the periphery of the substrate in one body with the cleaning nozzle moving, the first liquid nozzle supplying a second liquid onto the substrate when the substrate is cleaned by the cleaning nozzle, thereby forming a liquid film on the substrate, the second liquid supplied onto the substrate by the first liquid nozzle is supplied closer to a rotating center of the substrate than the cleaning nozzle;
a second liquid nozzle which supplies the second liquid to the rotating center of the substrate when the substrate is cleaned by the cleaning nozzle, thereby forming the liquid film on the substrate together with the first liquid nozzle; and
a control unit that controls the operation of the substrate cleaning apparatus so that the cleaning fluid is supplied by the cleaning nozzle and the second liquid supplied by the first liquid nozzle are supplied to the substrate simultaneously while the cleaning nozzle and the first liquid nozzle are moved in the radial direction of the substrate from the center of the substrate to the periphery of the substrate, and the second liquid is supplied to a center portion of the substrate from the second liquid nozzle when the cleaning nozzle and the first liquid nozzle get access to a vicinity of a periphery of the substrate.

17. A substrate cleaning apparatus as claimed in claim 11, wherein the cleaning nozzle is movable from a center of the substrate to a periphery of the substrate.

* * * * *